United States Patent
Lee

(10) Patent No.: US 10,854,572 B2
(45) Date of Patent: Dec. 1, 2020

(54) METHOD FOR MANUFACTURING ANISOTROPIC CONDUCTIVE ADHESIVE INCLUDING GAPPER AND METHOD FOR MOUNTING COMPONENT USING GAPPER

(71) Applicant: NOPION.CO.LTD, Suwon-si (KR)

(72) Inventor: Kyung Sub Lee, Suwon-si (KR)

(73) Assignee: NOPION.CO.LTD, Suwon-si (KR)

( * ) Notice: Subject to any disclaimer, the term of this patent is extended or adjusted under 35 U.S.C. 154(b) by 0 days.

(21) Appl. No.: 16/491,893

(22) PCT Filed: Apr. 26, 2018

(86) PCT No.: PCT/KR2018/004822
§ 371 (c)(1),
(2) Date: Sep. 6, 2019

(87) PCT Pub. No.: WO2018/199639
PCT Pub. Date: Nov. 1, 2018

(65) Prior Publication Data
US 2020/0010740 A1    Jan. 9, 2020

(30) Foreign Application Priority Data
Apr. 26, 2017  (KR) .......................... 10-2017-0053765

(51) Int. Cl.
*H01L 23/00*   (2006.01)
*C09J 5/06*    (2006.01)
(Continued)

(52) U.S. Cl.
CPC .............. *H01L 24/29* (2013.01); *C09J 5/06* (2013.01); *C09J 9/02* (2013.01); *C09J 11/08* (2013.01);
(Continued)

(58) Field of Classification Search
CPC ...... C09J 5/06; C09J 11/08; C09J 9/02; H01L 24/27; H01L 24/29; H01L 24/83;
(Continued)

(56) References Cited

U.S. PATENT DOCUMENTS 5,616,164 A * 4/1997 Ochiai .................. B23K 35/36
75/342
5,878,943 A * 3/1999 Nishikawa ........... B23K 1/0016
228/205

(Continued)

FOREIGN PATENT DOCUMENTS

KR        10-0149721 B1     6/1998
KR     10-2003-0086812 A    11/2003
(Continued)

*Primary Examiner* — Errol V Fernandes
*Assistant Examiner* — Jeremy J Joy
(74) *Attorney, Agent, or Firm* — Novick, Kim & Lee, PLLC; Jae Youn Kim; Jihun Kim

(57) ABSTRACT

Provided relates to a method for manufacturing an anisotropic conductive adhesive and a method for mounting a component using an anisotropic conductive adhesive, and provides a method for manufacturing an anisotropic conductive adhesive, including: a process of removing a first oxide film on solder particles by using a first reducing agent; and a process of manufacturing an anisotropic conductive adhesive by mixing the solder particles, a gapper, and an adhesive resin.

12 Claims, 14 Drawing Sheets

(51) Int. Cl.
*C09J 9/02* (2006.01)
*C09J 11/08* (2006.01)

(52) U.S. Cl.
CPC .............. *H01L 24/13* (2013.01); *H01L 24/16* (2013.01); *H01L 24/27* (2013.01); *H01L 24/32* (2013.01); *H01L 24/83* (2013.01); *H01L 2224/27428* (2013.01); *H01L 2224/29209* (2013.01); *H01L 2224/29211* (2013.01); *H01L 2224/29213* (2013.01); *H01L 2224/29239* (2013.01); *H01L 2224/29247* (2013.01); *H01L 2224/73204* (2013.01); *H01L 2224/83203* (2013.01); *H01L 2224/83851* (2013.01)

(58) Field of Classification Search
CPC . H01L 2224/83851; H01L 2224/83203; H01L 24/13; H01L 24/32; H01L 24/16; H01L 2224/73204
See application file for complete search history.

(56) References Cited

U.S. PATENT DOCUMENTS

| | | | | |
|---|---|---|---|---|
| 7,247,381 | B1* | 7/2007 | Watanabe | H05K 3/323 428/413 |
| 8,034,447 | B2* | 10/2011 | Sakai | H05K 3/323 428/356 |
| 2007/0054984 | A1* | 3/2007 | Jun | H05K 3/323 523/204 |
| 2007/0075436 | A1* | 4/2007 | Watanabe | H01L 23/5389 257/778 |
| 2009/0047534 | A1* | 2/2009 | Sakai | H05K 3/323 428/539.5 |
| 2009/0161328 | A1* | 6/2009 | Sakai | H05K 3/323 361/760 |
| 2010/0006625 | A1* | 1/2010 | Eom | H05K 13/0465 228/164 |
| 2012/0052677 | A1* | 3/2012 | Zenner | B23K 35/302 438/613 |
| 2012/0118480 | A1* | 5/2012 | Paik | C09J 5/06 156/73.1 |
| 2013/0277092 | A1* | 10/2013 | Ebe | B23K 35/3618 174/251 |
| 2015/0008022 | A1* | 1/2015 | Masui | B23K 35/3618 174/257 |
| 2017/0107406 | A1* | 4/2017 | Araki | C09J 9/02 |

FOREIGN PATENT DOCUMENTS

| | | |
|---|---|---|
| KR | 10-2009-0051002 A | 5/2009 |
| KR | 10-2009-0052300 A | 5/2009 |
| KR | 10-2011-0006012 A | 1/2011 |
| KR | 10-2011-0114946 A | 10/2011 |
| KR | 10-2013-0109235 A | 10/2013 |

* cited by examiner

METHOD FOR MANUFACTURING ANISOTROPIC CONDUCTIVE ADHESIVE INCLUDING GAPPER AND METHOD FOR MOUNTING COMPONENT USING GAPPER

TECHNICAL FIELD

The present invention relates to a method for manufacturing an anisotropic conductive adhesive and a method for mounting a component using an anisotropic conductive adhesive.

BACKGROUND ART

In the display industry, a lot of effort has recently been made to miniaturize components, lower the prices of components, and enhance the performance of components. In this regard, the importance of bonding a drive chip to a lower substrate (mounting a drive chip on a lower substrate) using an anisotropic conductive adhesive continues to grow.

In general, an anisotropic conductive adhesive is composed of an adhesive resin and conductive particles dispersed within the adhesive resin. As the conductive particles, materials such as silver (Ag), copper (Cu), nickel (Ni), carbon (C), metal-coated polymer balls, and insulator-coated metal balls have been used.

For example, if a drive chip and a lower substrate are bonded to each other using an anisotropic conductive adhesive composed of insulator-coated metal balls and an adhesive resin, a pattern on the lower substrate is electrically connected to the drive chip through the bonding. As such, if the bonding is made using the anisotropic conductive adhesive, the distance between the pattern and the drive pattern is short, and, thus, the bonded components may have excellent electrical characteristics. Further, a mount area required to mount the drive chip on the lower substrate may be minimized.

The process of bonding the drive chip to the lower substrate using the anisotropic conductive adhesive may be typically performed as described below.

First, the lower substrate is loaded. A loading error which occurs when the lower substrate is loaded may be measured by vision or corrected in a subsequent process.

Then, the anisotropic conductive adhesive is located on an upper surface of the lower substrate. If the anisotropic conductive adhesive is in the form of paste, it is coated on the upper surface of the lower substrate. If the anisotropic conductive adhesive is in the form of a film, it is attached to the upper surface of the lower substrate.

Thereafter, pre-bonding is performed. The drive chip is loaded on an upper surface of the anisotropic conductive adhesive so that the drive chip and the lower substrate are aligned with each other. Then, the drive chip may be applied with heat ranging from 60° C. to 90° C. and a micro-pressure ranging from 0.3 Mpa to 1 MPa for about 3 seconds to about 5 seconds. The heat and micro-pressure applied to the drive chip may be transmitted to the anisotropic conductive adhesive, and the drive chip and the lower substrate are pre-bonded to each other via the anisotropic conductive adhesive.

Then, bonding is performed. The drive chip may be applied with heat ranging from 150° C. to 200° C. and a pressure ranging from 30 Mpa to 100 MPa for about 10 seconds. The pressure and heat applied to the drive chip may be transmitted to the anisotropic conductive adhesive, and, thus, the distance between the drive chip and the lower substrate decreases and the adhesive resin is cured. Therefore, the drive chip and the lower substrate are bonded to each other via the anisotropic conductive adhesive.

According to the above-described conventional component mounting process (i.e., component bonding process) using the conventional anisotropic conductive adhesive, when the mounting of components are completed, conductive particles of the anisotropic conductive adhesive are located between upper terminals of an upper substrate (e.g., a substrate of the drive chip) and lower terminals of the lower substrate. The upper terminals and the lower terminals are electrically connected to each other via the conductive particles.

However, the conductive particles are not in the form of a bonding body, but in the form of numerous particles. Therefore, when the anisotropic conductive adhesive is located between the upper and lower substrates, the conductive particles may not exist on the surfaces of some lower terminals. In this case, unlike the upper and lower terminals which are electrically connected to each other via the conductive particles during the bonding process, i) some lower terminals on which the conductive particles do not exist and the upper terminals corresponding thereto may be electrically open. Further, ii) even if the upper and lower terminals are electrically connected to each other, the electrical connection is made by the conductive particles which are in simple mechanical contact with the upper and lower terminals. Due to the above-described reasons i) and ii), the anisotropic conductive adhesive has a low conductivity and thus its contact resistance becomes unstable. When the contact resistance of the anisotropic conductive adhesive becomes unstable, the performance of the bonded components may be degraded.

Further, even if the upper and lower substrates are bonded to each other by curing of the adhesive resin during the bonding process, the upper and lower substrates are bonded to each other only using the adhesive resin without a solid bonding body. In this case, the anisotropic conductive adhesive has a low bond strength so that any one substrate may be separated.

Meanwhile, during the bonding process, a bond thickness (i.e., the distance between the upper and lower terminals of the bonded upper and lower substrates) varies depending on a pressure applied to the upper substrate. If a high pressure is applied to the upper substrate, the bond thickness is small, and if a low pressure is applied to the upper substrate, the bond thickness is large. However, even if the pressure applied to the upper substrate is adjusted, it is not actually easy to precisely regulate the bond thickness.

CITATION LIST

Patent Literature

[Patent Literature 1]
  Korean Patent No 10-0149721 (registered on Jun. 9, 1998)
[Patent Literature 2]
  Korean Patent Laid-open Publication No. 10-2009-0052300 (registered on May 25, 2009)

SUMMARY OF INVENTION

Technical Problem

To solve the above-described problem, the present invention is conceived to manufacture an anisotropic conductive adhesive including a gapper and thus to regulate a bond thickness using the gapper during a component mounting process. Also, the present invention is conceived to suppress the leakage of molten solder and an adhesive resin between upper and lower substrates using the gapper and the leakage of the molten solder, which forms a solder bump, from a region between upper and lower terminals.

However, problems to be solved by the present invention are not limited to the above-described problems. Although not described herein, other problems to be solved by the present invention can be clearly understood by a person with ordinary skill in the art from the following descriptions.

Solution to Problem

To achieve the above-described purposes, the present invention has a constitution as described below.

There is provided a method for manufacturing an anisotropic conductive adhesive including a gapper, including: a process of removing a first oxide film on solder particles by using a first reducing agent; and a process of manufacturing an anisotropic conductive adhesive by mixing the solder particles, a gapper, and an adhesive resin.

The gapper may include at least one material selected from the group consisting of a polymer bead, a polymer particle, an inorganic particle, and mixtures thereof.

The polymer bead may include at least one material selected from the group consisting of polymethyl methacrylate, polystyrene, polyurethane, polyethylene, polyethyleneimine, polypropylene, and polyisobutylene.

The polymer particle may include Teflon or polyethylene.

The inorganic particle may include at least one material selected from the group consisting of alumina, silica, glass, and silicon carbide.

In the process of manufacturing the anisotropic conductive adhesive, the gapper may be mixed at 2 vol % to 60 vol % relative to the volume of the adhesive resin.

The method for manufacturing an anisotropic conductive adhesive including a gapper may further include, between the process of removing the first oxide film and the process of manufacturing the anisotropic conductive adhesive: a process of adding the solder particles from which the first oxide film has been removed into a solvent; and a process of forming a second oxide film whose oxygen concentration is lower than that of the first oxide film on the added solder particles.

In the process of forming the second oxide film, the second oxide film may account for 25 wt ppm to 95 wt ppm relative to a total weight of the solder particles and the second oxide film.

In the process of forming the second oxide film, the solder particles and the solvent may be stirred to form the second oxide film.

In the process of forming the second oxide film, ultrasonic waves may be irradiated to the solvent into which the solder particles have been added to form the second oxide film.

In the process of forming the second oxide film, the solvent into which the solder particles have been added may be charged and left in an oven to form the second oxide film.

In the process of manufacturing the anisotropic conductive adhesive, a second reducing agent may be further mixed with the solder particles, the gapper, and the adhesive resin.

In the process of manufacturing the anisotropic conductive adhesive, the second reducing agent may be mixed at more than 0 wt % and less than 2 wt % relative to the weight of the solder particles.

There is also provided a method for mounting a component using a gapper.

Advantageous Effects of Invention

According to an example of the present invention configured as described above, a bond thickness (i.e., the distance between the upper and lower terminals) can be regulated using the gapper during a component mounting process. The bond thickness can be regulated using the gapper which varies in size.

Further, according to an example of the present invention, when thermocompression bonding is performed during the component mounting process, the gapper functions to endure a pressure applied to the upper substrate. While the gapper endures the pressure, the distance between the upper substrate and the lower substrate is not shorter than necessary and the molten solder and the adhesive resin are not applied with more pressure than necessary. Therefore, the molten solder and the adhesive resin do not leak between the upper and lower substrates.

Furthermore, according to an example of the present invention, when thermocompression bonding is performed during the component mounting process, the gapper functions to suppress the leakage of the molten solder, which forms a solder bump, from a first region (i.e., a region between the upper and lower terminals) to a second region (i.e., a region between the upper terminals, a region between the lower terminals, and a region between solder bumps). Further, the adhesive resin whose viscosity increases after the solder bump is formed also functions to suppress the leakage of the molten solder from the first region to the second region. Therefore, there is a low possibility of a short circuit between the lower terminals, between the upper terminals, or between solder bonding bodies.

Further, the method for mounting a component using a gapper according to an example of the present invention can also be performed by existing facilities. There is no need to construct new facilities for performing the method for mounting a component. Accordingly, facility construction costs can be reduced.

Also, according to an example of the present invention, a part of the second oxide film on the solder particles can be removed using the second reducing agent during the component mounting process. Thus, it is possible to reduce the welding time of the solder particles. The welding time of the solder particles may be reduced to about 10 seconds. Therefore, the productivity of components can be increased.

Further, according to an example of the present invention, even if the second reducing agent is mixed during the process of manufacturing the anisotropic conductive adhesive, no void which may be caused by oxidized residues or water generated by a reaction between the second reducing agent and the second oxide film during the component mounting process may be generated. This is because the amount of the second reducing agent to be mixed is controlled to be small.

Furthermore, according to an example of the present invention, the anisotropic conductive adhesive including the solder particles dispersed uniformly within the adhesive resin can be manufactured by appropriately controlling the thickness of the oxide film on the solder particles (i.e., by appropriately controlling the oxygen concentration of the oxide film on the solder particles) during the process of manufacturing the anisotropic conductive adhesive. If the component mounting process is performed using the anisotropic conductive adhesive manufactured as described above, the manufactured anisotropic conductive adhesive does not include solder particles being agglomerated. Thus, a bridge is less likely to be formed. Therefore, it is possible to suppress a short circuit between the lower terminals, between the upper terminals, or between the solder bonding bodies.

Also, according to an example of the present invention, there is low possibility of a short circuit. Therefore, the method for mounting a component using the gapper according to an example of the present invention can be applied to mounting a component having a micro-pitch.

Further, according to an example of the present invention, when a component is mounted using the anisotropic conductive adhesive, the solder particles are welded on the upper and lower terminals without voids. Thus, compared to a conventional technology in which conductive particles are in simple mechanical contact with upper and lower terminals, the anisotropic conductive adhesive has a stable contact resistance and a high bond strength.

Furthermore, according to an example of the present invention, it is possible to manufacture an anisotropic conductive adhesive including low-melting point solder particles. The anisotropic conductive adhesive including low-melting point solder particles also has all of the above-described effects.

Also, according to an example of the present invention, the component mounting process can be performed at a low temperature using the anisotropic conductive adhesive including low-melting point solder particles. In this case, there are advantages in terms of energy saving and cost saving.

Further, according to an example of the present invention, a component bonded by using the anisotropic conductive adhesive including low-melting point solder particles is not manufactured at a high-temperature process and thus has excellent thermal fatigue characteristics.

DESCRIPTION OF EMBODIMENTS

Figure 1A:
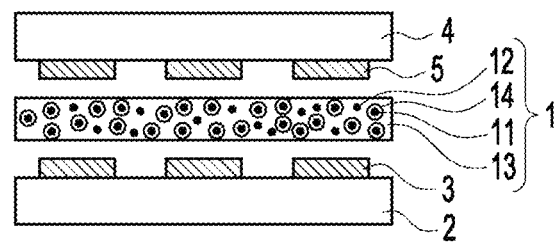
FIG. 1A through FIG. 1D illustrate an example of a component mounting process using a self-welded anisotropic conductive adhesive.

Hereafter, examples of the present invention will be described in detail with reference to the accompanying drawings so that the present invention may be readily implemented by a person with ordinary skill in the art. However, it is to be noted that the present invention is not limited to the example embodiments but can be embodied in various other ways.

In the drawings, parts irrelevant to the description are omitted for the simplicity of explanation, and like reference numerals denote like parts through the whole document. The terms used herein are used only to describe various examples, but do not intend to limit the present invention. When a first element is referred to as being "connected to (coupled to, contacted with, or combined with)" a second element, the first element may be "directly connected to" the second element or "indirectly connected to" the second element via still a third element. A singular expression includes a plural expression unless it is clearly construed in a different way in the context. Further, the terms used herein, such as "including" or "having", are used only to designate the features, numbers, steps, operations, constituent elements, parts, or combinations thereof described in the specification, but should be construed not to exclude existence or addition of one or more other features, numbers, steps, operations, constituent elements, parts, or combinations thereof.

Prior to explanation of the present invention, we will explain how the present invention has been obtained. An anisotropic conductive adhesive of the present invention includes an adhesive resin and solder particles dispersed within the adhesive resin. A component mounting process using the anisotropic conductive adhesive may be performed as described below.

First, the anisotropic conductive adhesive is located between upper and lower substrates.

Then, the anisotropic conductive adhesive is applied with heat. Since the heated solder particles increases in surface energy, the heated solder particles are agglomerated while moving to upper and lower terminals of the upper and lower substrates to lower the surface energy. At the same time, the solder particles are melted, and molten solder is wetted on the surfaces of the lower and upper terminals.

Since the solder particles are introduced to the upper and lower terminals while being agglomerated to lower the surface energy, the heated solder particles are located in a region (hereinafter, referred to as "first region") between the upper and lower terminals. Further, the heated solder particles are melted while being agglomerated and introduced into the first region. This can be described that "the molten solder is self-aligned in the first region".

After the wetting of the molten solder, if more molten solder is continuously introduced into the first region, a solder bump which is the molten solder connecting the upper and lower terminals is finally formed.

Meanwhile, the heated adhesive resin decreases in viscosity in the beginning and thus increases the mobility of the solder particles so that the solder particles can move to the first region. The viscosity of the adhesive resin reaches the highest level after the molten solder is self-aligned and the solder bump is formed. The adhesive resin is continuously applied with heat and cured after the solder bump is formed. The adhesive resin bonds the upper and lower substrates to each other while being cured.

Then, the heat is removed so that the solder bump is cooled and solidified. The solder bump formed throughout the upper and lower terminals bonds the upper and lower terminals to each other while being solidified. Also, a solder bonding body which is the solidified solder bump electrically connects the upper and lower terminals to each other.

In the above-described component mounting process, the process of bonding the upper and lower terminals by the solder particles when they are melted and solidified is a process of welding the solder particles on the upper and lower terminals. That is, an anisotropic conductive adhesive of the present invention is an adhesive for the purpose of welding solder particles (hereinafter, referred to as "self-welded anisotropic conductive adhesive").

However, even if the self-welded anisotropic conductive adhesive is used for mounting components, the solder particles may not be welded. For example, if the solder particles have a natural oxide film (hereinafter, referred to as "first oxide film") around them, the solder particles are stable and has low surface energy. The stable solder particles are not agglomerated well and not concentrated well in the first region during the above-described component mounting process even when being applied with heat. In other words, the solder particles may not be welded. Therefore, there is a problem that the solder particles may not be welded due to the first oxide film on the solder particles (first problem).

To solve the first problem, a reducing agent may be added to the adhesive resin. Specifically, during a process of manufacturing a self-welded anisotropic conductive adhesive, solder particles and an adhesive resin are mixed and then, a reducing agent may be further mixed with the solder particles and the adhesive resin. Thus, a self-welded anisotropic conductive adhesive including the reducing agent can be manufactured.

Herein, the reducing agent reacts with surrounding oxygen only when it is applied with heat. Therefore, the reducing agent is just mixed with the solder particles having the first oxide film thereon but does not remove the first oxide film before being applied with heat during the component mounting process.

FIG. 1A through FIG. 1D illustrate an example of a component mounting process using a self-welded anisotropic conductive adhesive including a reducing agent. An example of a component mounting process using a self-welded anisotropic conductive adhesive including a reducing agent will be described with reference to FIG. 1A through FIG. 1D.

Referring to FIG. 1A first, a lower substrate 2 including lower terminals 3, an anisotropic conductive adhesive 1, and an upper substrate 4 including upper terminals 5 are prepared. The lower substrate 2 and the upper substrate 4 may be a printed circuit board (PCB), a flexible PCB (FPCB), an IC substrate, a glass substrate, or the like. The anisotropic conductive adhesive 1 is composed of an adhesive resin 13, solder particles 11 dispersed within the adhesive resin 13, and a reducing agent 12 dispersed within the adhesive resin 13. A first oxide film 14 is formed on the solder particles 11.

Then, the anisotropic conductive adhesive 1 is located on upper surfaces of the lower substrate 2 and the lower terminals 3. If the anisotropic conductive adhesive 1 is in the form of a film, it is attached to the upper surfaces of the lower substrate 2 and the lower terminals 3. If the anisotropic conductive adhesive 1 is in the form of paste, it is coated on the upper surfaces of the lower substrate 2 and the lower terminals 3.

Then, the upper substrate 4 and the upper terminals 5 are located on an upper surface of the anisotropic conductive adhesive 1.

Then, the anisotropic conductive adhesive 1 is applied with heat. The heated reducing agent 12 reacts with the first oxide film 14 around the solder particles 11 so as to remove the first oxide film 14. The solder particles without the first oxide film 14 thereon have high surface energy. Therefore, the heated solder particles 11 may be agglomerated while moving to a first region 6. The solder particles 11 are melted by heat while moving to the first region 6 and being agglomerated.

Figure 1B:
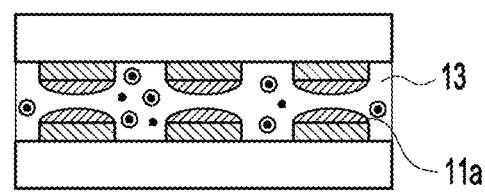

Molten solder 11a is wetted on the surfaces of the lower terminals 3 or the upper terminals 5 while being self-aligned (FIG. 1B). Meanwhile, as described above, the heated adhesive resin 13 decreases in viscosity and thus increases the mobility of the solder particles 11.

Figure 1C:
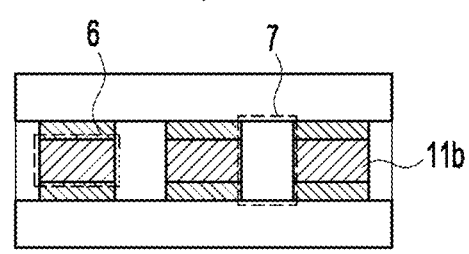

If more molten solder 11a is introduced into the first region 6, a solder bump 11b connecting the upper and lower terminals 3 and 5 is formed (FIG. 1C). In this case, a region between the upper terminals 5, a region between the lower terminals 3, and a region between the solder bump 11b (hereinafter, referred to as "second region 7") are mainly formed of the adhesive resin 13. As described above, the viscosity of the adhesive resin 13 reaches the highest level after the solder bump 11b is formed. After the adhesive resin 13 has the highest viscosity, it is continuously applied with heat and cured. The adhesive resin 13 bonds the upper and lower substrates 2 and 4 to each other while being cured.

Figure 1D:
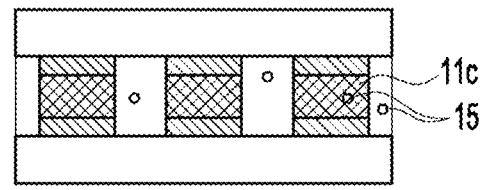

Then, referring to FIG. 1D, the heat applied to the anisotropic conductive adhesive 1 is removed. Therefore, the solder bump 11b is cooled and solidified and becomes a solder bonding body 11c that bonds the upper and lower terminals 3 and 5 in the first region 6. In other words, the solder particles 11 are welded on the upper and lower terminals 3 and 5 in the first region 6. The solder bonding body 11c electrically connects the lower terminals 3 and the upper terminals 5 to each other.

The self-welded anisotropic conductive adhesive including the reducing agent can overcome the above-described first problem. Unlike a conventional technology in which unmolten conductive particles are in simple mechanical contact with upper and lower terminals, the self-welded anisotropic conductive adhesive is welded on the upper and lower terminals. Therefore, compared to the conventional technology, the self-welded anisotropic conductive adhesive is expected to have a stable contact resistance and a high bond strength.

However, when the component mounting process is performed using the self-welded anisotropic conductive adhesive including the reducing agent, the reducing agent reacts with the first oxide film and thus generates oxidized residues or water. Referring to FIG. 1D, the oxidized residues or water may cause voids 15 within the self-welded anisotropic conductive adhesive 1. That is, even if the solder particles are welded, the oxidized residues or water generated by the reaction of the reducing agent may cause voids within the anisotropic conductive adhesive (second problem). The anisotropic conductive adhesive including voids therein may have an unstable contact resistance and a low bond strength.

To solve the second problem, the first oxide film on the solder particles may be removed completely by the first reducing agent before the adhesive resin and the solder particles are mixed during the process of manufacturing the self-welded anisotropic conductive adhesive. The self-welded anisotropic conductive adhesive may be manufactured by mixing the solder particles from which the first oxide film has been removed with the adhesive resin. In this case, there is no need to further mix the reducing agent with the mixture of the solder particles and the adhesive resin. Therefore, it is possible to suppress the generation of voids which may be caused by a reaction of the reducing agent during the component mounting process. Further, since the first oxide film does not exist around the solder particles during the component mounting process, it is expected that the solder particles can be welded without difficulty.

During the process of manufacturing the self-welded anisotropic conductive adhesive, the removal of the first oxide film on the solder particles by the first reducing agent before the solder particles and the adhesive resin are mixed can be considered reasonable at first sight. However, when the first oxide film on the solder particles is removed completely, the surface energy of the solder particles increases. Thus, the force of attraction between the solder particles increases. Therefore, the solder particles may be agglomerated and the dispersibility of the solder particles within the adhesive resin may decrease.

Figure 2A:
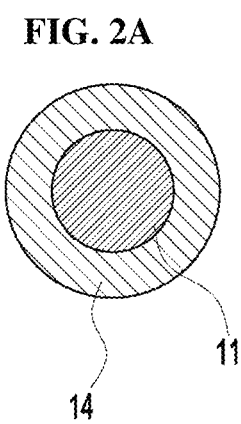
FIG. 2A through FIG. 2C are diagrams illustrating the agglomeration of solder particles in case of removing a first oxide film.
Figure 2B:
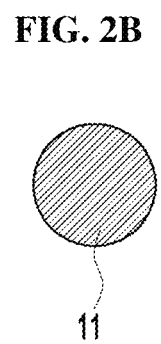
Figure 2C:
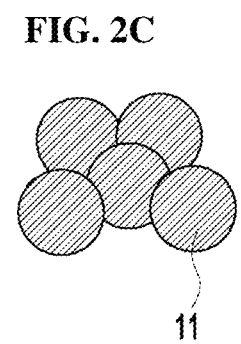

FIG. 2A through FIG. 2C are diagrams illustrating the agglomeration of solder particles in case of removing a first oxide film. If the first oxide film 14 around the solder particles 11 as shown in FIG. 2A is removed, the solder particles 11 are transformed as shown in FIG. 2B. However, the solder particles 11 without the first oxide film 14 may be agglomerated as shown in FIG. 2C.

Figure 3A:
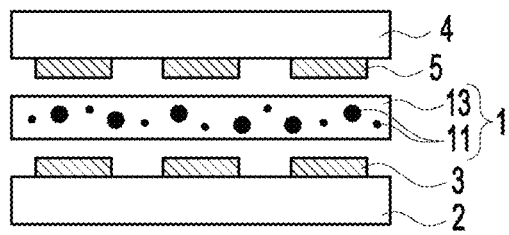
FIG. 3A through FIG. 3D illustrate an example of a component mounting process using a self-welded anisotropic conductive adhesive which is manufactured through the removal of a first oxide film.

FIG. 3A through FIG. 3D illustrate an example of a component mounting process using a self-welded anisotropic conductive adhesive which is manufactured through the removal of a first oxide film. Referring to FIG. 3A, some solder particles 11 having a relatively large size are present within the adhesive resin 13, and, thus, the solder particles 11 have a low dispersibility. The solder particles 11 having a relatively large size in FIG. 3A are the solder particles 11 agglomerated after the first oxide film is removed as shown in FIG. 2A through FIG. 2C.

Figure 3B:
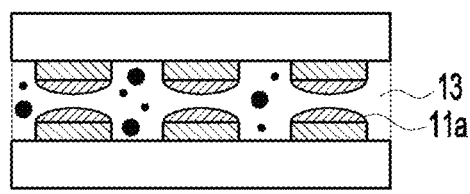
Figure 3C:
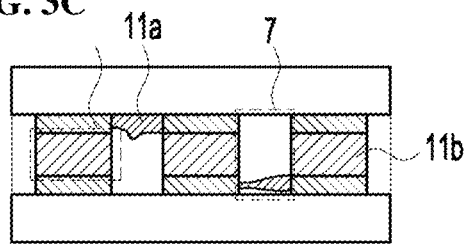

Referring to FIG. 3B, as described above, when the anisotropic conductive adhesive 1 is applied with heat, the molten solder 11a is self-aligned in the first region 6 and wetted on the upper terminals 5 or the lower terminals 3. Referring to FIG. 3C, as described above, if more molten solder 11a is introduced into the first region 6, the solder bump 11b is formed.

However, the solder particles 11 from which the first oxide film has been removed before the solder particles 11 are mixed with the adhesive resin 13 has high surface energy even before being applied with heat during the component mounting process. Therefore, during the process illustrated in FIG. 3B, an excessive amount of the solder particles 11 may be agglomerated while moving to the first region 6, and, thus, an excessive amount of the molten solder 11a may be generated. In this case, referring to FIG. 3C, the molten solder 11a may form the solder bump 11b in the first region 6 and a part of the molten solder 11a may be located in the second region 7. Particularly, the solder particles 11 already agglomerated during the process of manufacturing the self-welded the anisotropic conductive adhesive 1 may be more agglomerated so that the molten solder 11a is likely to be bigger in size.

Figure 3D:
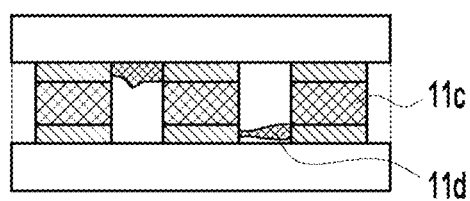

Referring to FIG. 3D, as described above, if the heat is removed, the solder bonding body 11c is formed. In this case, the molten solder 11a located in the second region 7 in FIG. 3C may be solidified so that a bridge 11d may be formed. The formation of the bridge 11d means that a short circuit occurs between the lower terminals 3, between the upper terminals 5, or between the solder bonding bodies 11c.

That is, if the first oxide film on the solder particles is removed completely using the first reducing agent during the process of manufacturing the anisotropic conductive adhesive, the solder particles may be excessively agglomerated during the component mounting process, which may cause a short circuit (third problem).

To solve the third problem, during the process of manufacturing the self-welded anisotropic conductive adhesive, a second oxide film having a smaller thickness than the first oxide film may be formed on the solder particles after the first oxide film is removed from the solder particles and before the solder particles are mixed with the adhesive resin. Unlike the first oxide film which is a natural oxide film, the second oxide film is an artificial oxide film and has a lower oxygen concentration than the first oxide film. In other words, a solution to the third problem is to appropriately control an oxide film (i.e., oxygen concentration) of the solder particles during the process of manufacturing the anisotropic conductive adhesive.

During the process of manufacturing the self-welded anisotropic conductive adhesive, the solder particles on which the second oxide film is formed are not agglomerated due to the second oxide film. This is because the solder particles have lower surface energy due to the second oxide film than the solder particles from which the first oxide film has been removed completely. Therefore, the solder particles have a high dispersibility within the adhesive resin.

Figure 4A:
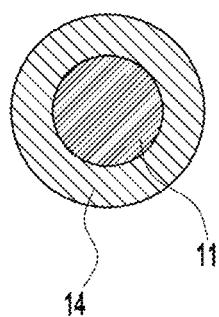
FIG. 4A through FIG. 4C are diagrams illustrating the dispersion of solder particles in case of controlling an oxide film according to an example of the present invention.
Figure 4B:
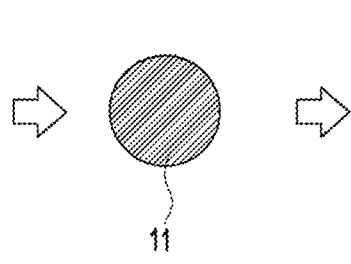
Figure 4C:
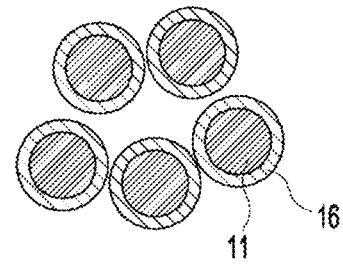

FIG. 4A through FIG. 4C are diagrams illustrating the dispersion of solder particles in case of controlling an oxide film. Referring to FIG. 4A, the solder particles 11 are covered by the first oxide film 14. The first oxide film 14 is naturally formed by a reaction between the solder particles 11 and atmosphere. If the solder particles 11 have the first oxide film 14, the above-described first problem or second problem may occur. Therefore, as shown in FIG. 4B, the first oxide film 14 is removed completely. However, if the first oxide film 14 is removed completely, the above-described third problem may occur. Therefore, after the first oxide film 14 is removed completely, a second oxide film 16 covering the solder particles 11 is formed as shown in FIG. 4C. The second oxide film 16 has a smaller thickness (i.e., has a lower oxygen concentration) than the first oxide film 14. The second oxide film 16 enables the solder particles 11 not be agglomerated and to be dispersed uniformly within the adhesive resin.

Figure 5A:
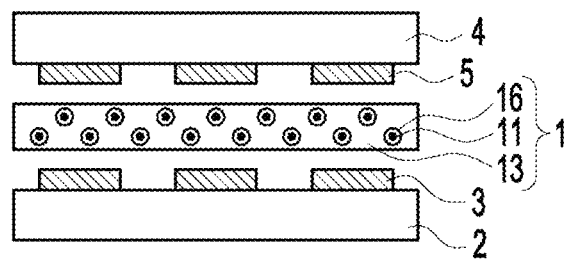
FIG. 5A through FIG. 5D illustrate an example of a component mounting process using a self-welded anisotropic conductive adhesive which is manufactured through the control of oxide films.

FIG. 5A through FIG. 5D illustrate an example of a component mounting process using a self-welded anisotropic conductive adhesive which is manufactured through the control of oxide films (i.e., through the removal of the first oxide film and the formation of the second oxide film). Referring to FIG. 5A, the anisotropic conductive adhesive 1 prepared for the component mounting process includes the adhesive resin 13 and the solder particles 11 dispersed uniformly within the adhesive resin 13. Further, the solder particles 11 are covered by the second oxide film 16.

Figure 5B:
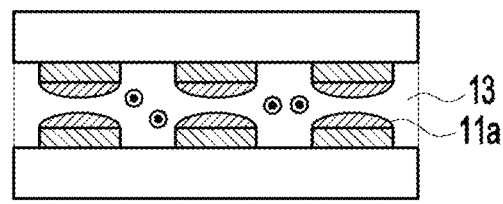
Figure 5C:
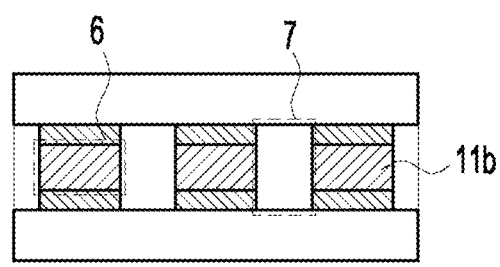
Figure 5D:
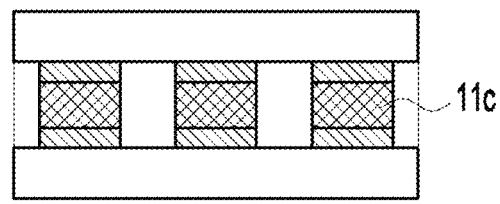

As described above with reference to FIG. 1 or FIG. 3, when the anisotropic conductive adhesive 1 is applied with heat, the molten solder 11a is wetted (FIG. 5B) and the solder bump 11b is formed (FIG. 5C). Then, if the heat is removed, the solder bump 11b is solidified and becomes the solder bonding body 11c (FIG. 5D).

As described above, if the component mounting process is performed using the self-welded the anisotropic conductive adhesive 1 including the solder particles 11 which are dispersed uniformly and have relatively low surface energy due to the second oxide film 16, the heated solder particles 11 are not excessively agglomerated during the process illustrated in FIG. 5B. Thus, a bridge is less likely to be formed. That is, the above-described third problem can be solved.

Further, the solder particles 11 on which the second oxide film 16 is formed (FIG. 4C) are more stable than the solder particles from which the first oxide film 14 has been removed completely (FIG. 2B), but not more stable than the solder particles 11 having the first oxide film 14 thereon (FIG. 2A). This is because the second oxide film 16 has a lower oxygen concentration than the first oxide film 14. Therefore, as described above, the solder particles 11 on which the second oxide film 16 is formed are not excessively agglomerated during the component mounting process (FIG. 5B and FIG. 5C), but agglomerated appropriately and welded (FIG. 5D). That is, the above-described first problem does not occur.

Further, since the solder particles can be welded, there is no need to further mix a reducing agent with the solder particles having the second oxide film thereon and the adhesive resin during the process of manufacturing the anisotropic conductive adhesive. Therefore, it is possible to suppress the generation of voids which may be caused by a reaction of the reducing agent during the component mounting process. That is, the above-described second problem does not occur.

The second oxide film which can solve all of the above-described first to third problems may have an oxygen concentration of 25 wt ppm to 95 wt ppm relative to a total weight of the solder particles and the second oxide film. In other words, if the second oxide film has an oxygen concentration of less than 25 wt ppm, the second oxide film is too thin. Thus, the above-described third problem may occur. If the second oxide film has an oxygen concentration of more than 95 wt ppm, the second oxide film may be too thick. Thus, the above-described first problem may occur. In this case, if a reducing agent is further mixed with the solder particles and the adhesive resin to overcome the first problem, the above-described second problem may occur.

If the component mounting process is performed using the self-welded anisotropic conductive adhesive which is manufactured through the control of oxide films (i.e., through the removal of the first oxide film and the formation of the second oxide film), it takes a long time to perform the component mounting process (fourth problem). The time required for the heated solder particles 11 to be melted and self-aligned and to form the solder bump 11b and then form the solder bonding body 11c by removing heat is also needed for the solder particles 11 to be welded (FIG. 5B through FIG. 5D). It takes about 10 seconds to perform a conventional thermocompression bonding process (refer to the bonding process described in [Background Art]). In comparison, it takes about 30 seconds to weld the solder particles 11 shown in FIG. 5B through FIG. 5D.

To solve the above-described fourth problem, more precise control of the thickness of the oxide film on the solder particles may be considered. However, if the second oxide film does not have an optimum oxygen concentration ranging from 25 wt ppm to 95 wt ppm, the above-described first to third problems may occur, and if the second oxide film has the optimum oxygen concentration, the above-described fourth problem may occur.

Therefore, during the process of manufacturing the anisotropic conductive adhesive, the second oxide film on the solder particles is formed to have the above-described optimum oxygen concentration ranging from 25 wt ppm to 95 wt ppm, and a small amount of a second reducing agent may be further mixed with the solder particles having the second oxide film thereon and the adhesive resin. The amount of the second reducing agent may be set not to generate a large amount of oxidized residues or water during the component mounting process and thus not to generate voids. The small amount of the second reducing agent is just mixed with the solder particles having the second oxide film thereon and the adhesive resin but does not remove the second oxide film during the process of manufacturing the anisotropic conductive adhesive. However, during the component mounting process, the small amount of the second reducing agent is applied with heat and thus removes a part of the second oxide film. Therefore, it is possible to greatly reduce the welding time of the solder particles.

Figure 6A:
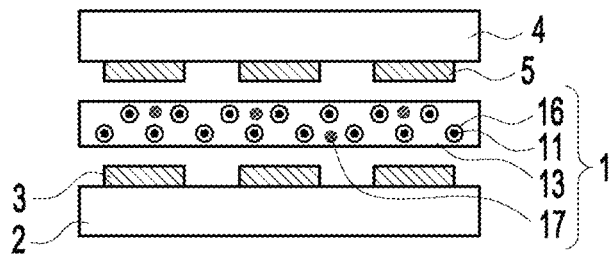
FIG. 6A through FIG. 6D illustrate an example of a component mounting process using a self-welded anisotropic conductive adhesive including a second reducing agent.

FIG. 6A through FIG. 6D illustrate an example of a component mounting process using a self-welded anisotropic conductive adhesive including a second reducing agent. Referring to FIG. 6A, the anisotropic conductive adhesive 1 prepared for the component mounting process includes the adhesive resin 13, the solder particles 11 dispersed uniformly within the adhesive resin 13, and a second reducing agent 17. Further, the solder particles 11 are covered by the second oxide film 16.

Figure 6B:
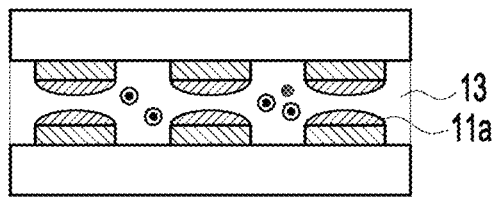
Figure 6C:
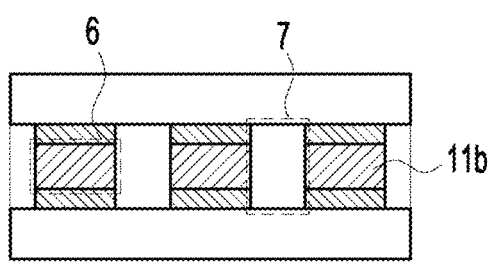

As described above with reference to FIG. 1, FIG. 3, or FIG. 5, when the anisotropic conductive adhesive 1 is applied with heat, the molten solder 11a is wetted (FIG. 6B) and the solder bump 11b is formed (FIG. 6C). Then, if the heat is removed, the solder bump 11b is solidified and becomes the solder bonding body 11c (FIG. 6D).

Figure 6D:
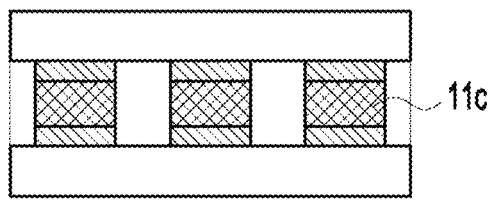

During the process of welding the solder particles 11 illustrated in FIG. 6B through FIG. 6D, the heated second reducing agent 17 can remove a part of the second oxide film 16 and thus can reduce the welding time of the solder particles 11. The above-described fourth problem can be solved. Therefore, the productivity of components can be increased.

The display or semiconductor industry requires a specific bond thickness (i.e., the distance between the upper and lower terminals when the upper and lower substrates are bonded completely). However, according to the component mounting processes using the above-described self-welded anisotropic conductive adhesive (FIG. 1, FIG. 3, FIG. 5, and FIG. 6), there is no means of regulating the bond thickness.

During the component mounting processes using the self-welded anisotropic conductive adhesive, heat is applied to the anisotropic conductive adhesive to form the solder bump. In this case, the application of a pressure, as well as heat, to the upper substrate to regulate the bond thickness can be considered. In the conventional component mounting process using the conventional anisotropic conductive adhesive, conductive particles having a certain strength can endure a pressure applied during a bonding process, and, thus, the bond thickness can be regulated to a certain degree (refer to the bonding process described in [Background Art]). However, in the component mounting process using the self-welded anisotropic conductive adhesive, the viscosity of the solder particles and the adhesive resin is low while the solder bump is formed. Therefore, if the upper substrate is applied with a pressure while the solder bump is formed, it is difficult to regulate the bond thickness. In this case, the molten solder and the adhesive resin may be leaked to the outside of the upper and lower substrates (fifth problem).

The present invention provides a method for mounting a component on an anisotropic conductive adhesive including a gapper which is further mixed with solder particles and an adhesive resin during a process of manufacturing the anisotropic conductive adhesive.

Hereafter, the present invention will be described more specifically. An anisotropic conductive adhesive, a component mounting process using the anisotropic conductive adhesive, and a method for manufacturing the anisotropic conductive adhesive will be described.

Figure 9A:
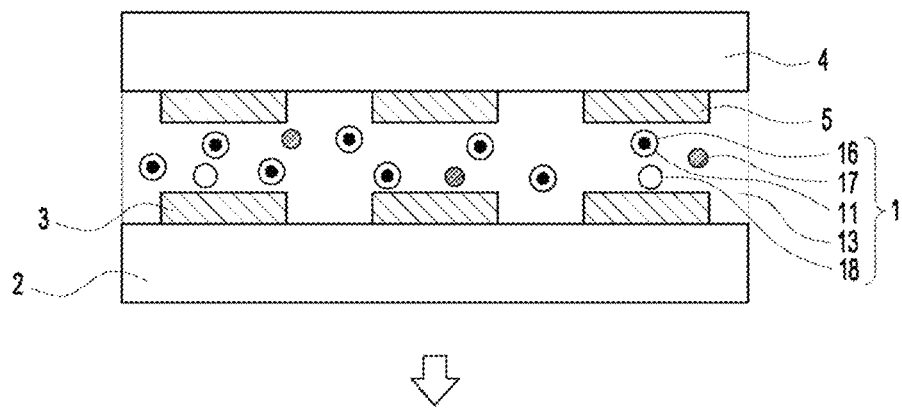
FIG. 9A through FIG. 9C illustrate a method for mounting a component using a gapper according to an example of the present invention.

Referring to FIG. 9A, the anisotropic conductive adhesive 1 according to an example of the present invention includes the adhesive resin 13, the solder particles 11, the second reducing agent 17, and a gapper 18. The anisotropic conductive adhesive 1 may further include an additive such as a curing agent, a curing accelerator, a modifier, or the like.

The adhesive resin 13 may include at least one resin of a thermosetting resin and a thermoplastic resin.

Thermosetting resin may include at least one selected from the group consisting of an epoxy resin, a silicon resin, an oxetane resin, a phenol resin, a (meth)acrylate resin, a polyester resin, a diallylphtalate resin, a maleimide resin, a polyimide resin, and a bismaleimide-triazine resin.

Thermoplastic resin may include at least one selected from the group consisting of an acetic acid vinyl resin, a polyvinyl alcohol resin, a polyvinyl butyral resin, a vinyl chloride resin, a (meth)acrylic resin, a phenoxy resin, a polyester resin, a polyimide resin, a polyamideimide resin, a siloxane-modified polyimide resin, a polybutadiene resin, an acrylic resin, a styrene resin, a polyethylene resin, a polypropylene resin, a polyamide resin, a cellulose resin, an isobutylene resin, vinylether resin, a liquid crystal polymer resin, a polyphenylene sulfide resin, a polyphenylene ether resin, a polyethersulfone resin, a polyetherimide resin, a polyetheretherketone resin, a polyurethane resin, a styrene-butadiene-styrene copolymer, a styrene-ethylene-butylene-styrene copolymer, a polyacetal resin, a polyvinyl butyral resin, a polyvinyl acetal resin, butyl rubber, chloroprene rubber, an acrylonitrile-butadiene copolymer, an acrylonitrile-butadiene-acrylate copolymer, an acrylonitrile-butadiene-styrene copolymer, and a polyacetate vinyl.

Preferably, the adhesive resin 13 is the above-described thermosetting resin. This is because mechanical characteristics, such as linear coefficient of expansion or coefficient of elasticity, of thermosetting resin after curing are more excellent than those of thermoplastic resin. Preferably, thermosetting resin may serve as a main ingredient and a small amount of thermoplastic resin may also be added. This is because thermoplastic resin can reduce stress which is generated during electrical connection.

The solder particles 11 may include at least one material selected from the group consisting of tin, indium, bismuth, silver, copper, and alloys thereof. The solder particles 11 is prepared for self-welding. Thus, preferably, the solder particles 11 may include at least one element of tin, indium, and bismuth as a main ingredient and a small amount of at least one element of silver and copper.

The size of the solder particles 11 may vary depending on the pitch size (i.e., the distance between two lower terminals or the distance between two upper terminals).

The gapper 18 is a material which is not melted even when being heated during the component mounting process. The gapper 18 includes at least one material selected from the group consisting of a polymer bead, a polymer particle, an inorganic particle, and mixtures thereof. The polymer bead may include at least one material selected from the group consisting of polymethylmethacrylate, polystyrene, polyurethane, polyethylene, polyethyleneimine, polypropylene, and polyisobutylene. The polymer particle may include Teflon or polyethylene. Further, the inorganic particle may include at least one material selected from the group consisting of alumina, silica, glass, and silicon carbide. The diameter and content of the gapper 18 will be described later. Hereafter, a component mounting process using the anisotropic conductive adhesive 1 will be described.

Figure 7A:
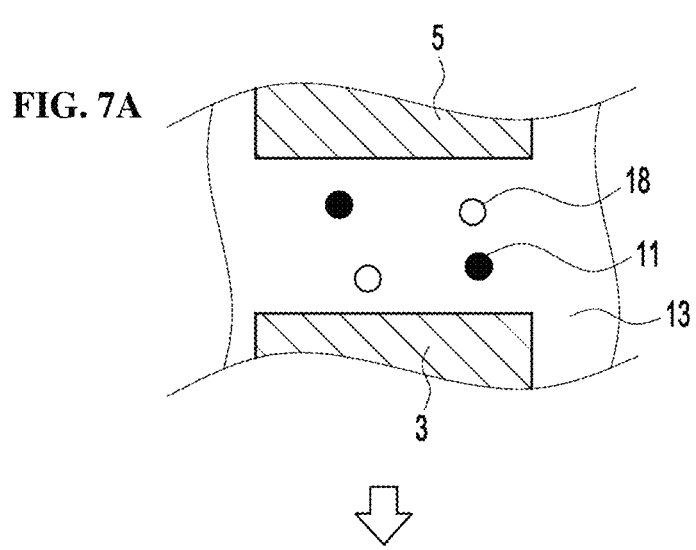
FIG. 7A through FIG. 7C are provided to explain characteristics of a gapper.
Figure 7B:
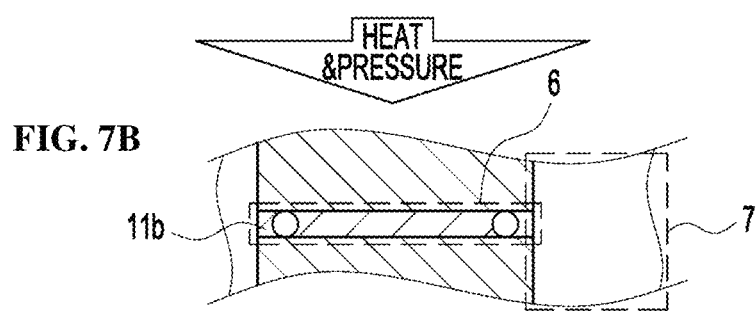
Figure 7C:
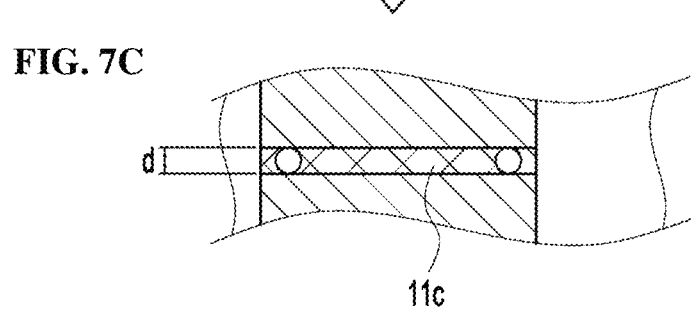

FIG. 7 is provided to explain characteristics of a gapper. FIG. 7A through FIG. 7C illustrate a component mounting process using the self-welded anisotropic conductive adhesive.

Referring to FIG. 7A first, the self-welded anisotropic conductive adhesive including the gapper 18 is located between the upper and lower substrates.

Then, referring to FIG. 7B, the upper substrate is thermocompression bonded. Thus, the distance between the upper terminals 5 and the lower terminals 3 decreases and the solder particles 11 becomes the solder bump 11b. As described above, the gapper 18 is not melted during the component mounting process and thus can be located between the upper and lower terminals 3 and 5 while remaining unmelted. In this case, the gapper 18 can suppress the leakage of the molten solder forming the solder bump 11b from the first region 6 to the second region 7.

Then, referring to FIG. 7C, heat and pressure are removed so that the solder bump 11b becomes the solder bonding body 11c. In this case, a diameter d of the gapper 18 is the bond thickness which is the distance between the upper and lower terminals 3 and 5. That is, the bond thickness can be regulated depending on the size of the gapper 18.

Figure 8:
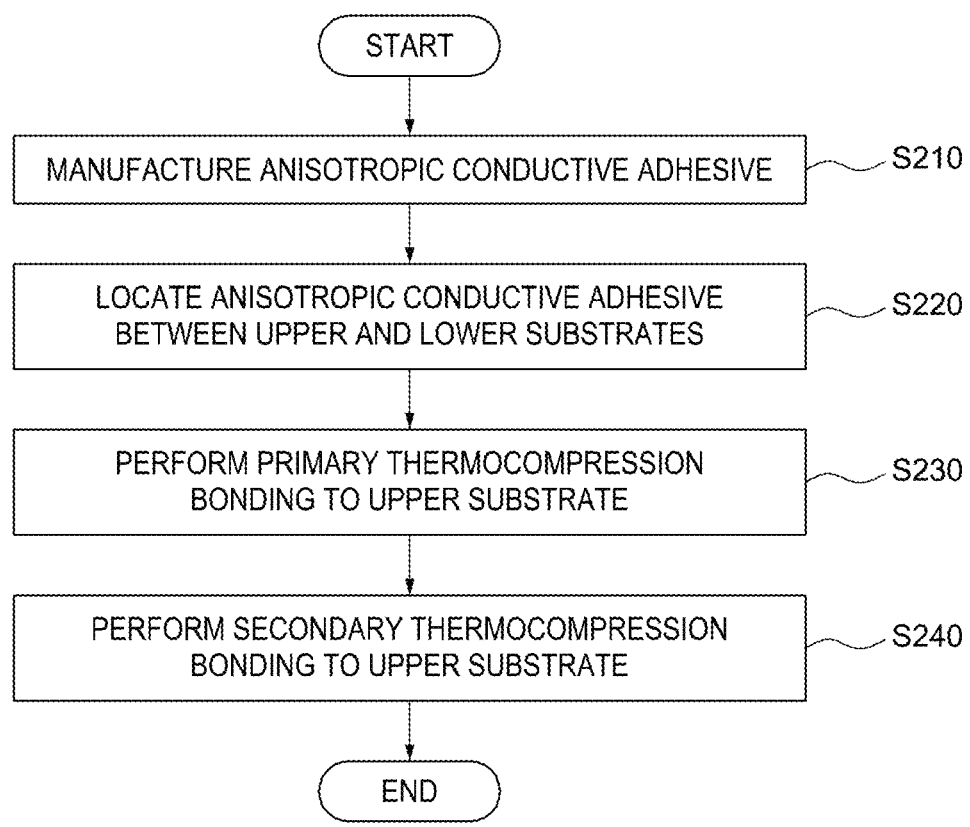
FIG. 8 is a flowchart showing a method for mounting a component using a gapper according to an example of the present invention.

FIG. 8 is a flowchart showing a method for mounting a component using a gapper according to an example of the present invention. FIG. 9 illustrates a method for mounting a component using a gapper according to an example of the present invention. The method for mounting a component using a gapper according to an example of the present invention will be described with reference to FIG. 8 and FIG. 9.

First, the anisotropic conductive adhesive 1 is prepared (S210). The anisotropic conductive adhesive 1 may include the adhesive resin 13, the solder particles 11 dispersed uniformly within the adhesive resin 13, the second reducing agent 17 mixed with the adhesive resin 13, and the gapper 18. The second oxide film 16 having an optimum thickness is formed on the solder particles 11 (FIG. 9A). The method for manufacturing an anisotropic conductive adhesive 1 will be described later. However, even if there is no concern about the occurrence of the above-described second problem, third problem or fourth problem, the above-described method for manufacturing an anisotropic conductive adhesive which may cause the second to fourth problems is not excluded.

Referring to FIG. 9A, the manufactured anisotropic conductive adhesive 1 is located between the upper and lower substrates 2 and 4 (S220). Specifically, the anisotropic conductive adhesive 1 is located on an upper surface of the lower substrate 2. If the anisotropic conductive adhesive 1 is in the form of paste, it is coated on the lower substrate 2. If the anisotropic conductive adhesive 1 is in the form of a film, it can be attached to the lower substrate 2. Then, the upper substrate 4 is loaded on the upper surface of the anisotropic conductive adhesive 1 so that the upper and lower substrates 2 and 4 are aligned with each other.

Then, the upper substrate 4 is primarily thermocompression bonded (S230). A pulse heater, which is also called as hot bar, may thermocompression bond the upper substrate 4. The hot bar may apply heat ranging from 60° C. to 90° C. and a micro-pressure ranging from 0.3 Mpa to 1 MPa to the upper substrate 4. The heat and micro-pressure applied to the upper substrate 4 is transmitted to the anisotropic conductive adhesive 1, and the upper and lower substrates 2 and 4 are pre-bonded to each other via the anisotropic conductive adhesive 1.

Figure 9B:
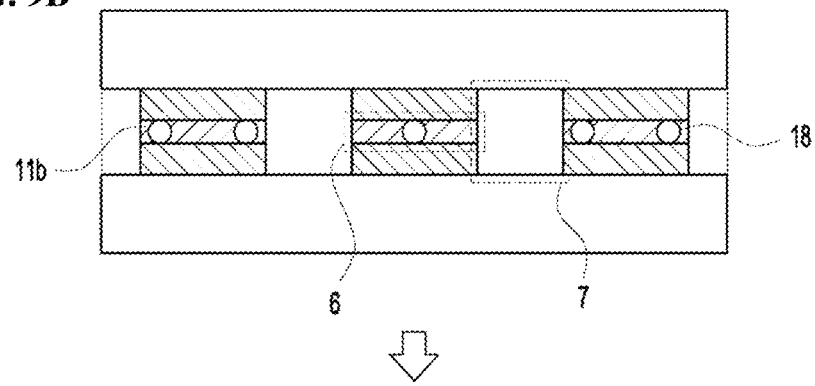

Then, referring to FIG. 9B, the upper substrate 4 is secondarily thermocompression bonded (S240). The secondary thermocompression bonding may also be performed by the hot bar. The hot bar may apply heat equal to or higher than the melting point of the solder particles 11 and a predetermined pressure to the upper substrate 4.

The heated solder particles 11 is melted, and molten solder is self-aligned and wetted on the surfaces of the upper terminals 5 or the lower terminals 3. Then, more molten solder is self-aligned to form the solder bump 11b. While the solder bump 11b is formed, the adhesive resin 13 has a low viscosity. After the solder bump 11b is formed, the viscosity of the adhesive resin 13 reaches the highest level. After having the highest viscosity, the adhesive resin 13 is cured and bonds the upper and lower substrates 2 and 4. This is already described above.

The upper substrate 4 is applied with a predetermined pressure and becomes close to the lower substrate 2. The upper substrate 4 gets closer and closer to the lower substrate 2 and then is brought into contact with the gapper 18. The gapper 18 is not melted in process S240 and maintains the distance between the upper and lower terminals to be as much as the diameter of the gapper 18 so that the upper substrate 4 cannot get closer to the lower substrate 2. When the adhesive resin 13 is cured and the upper and lower substrates 2 and 4 are bonded to each other, the diameter of the gapper 18 becomes the bond thickness. Considering the specifications required in the display or semiconductor industry, the diameter of the gapper 18 may be 2 μm to 100 μm. The bond thickness can be regulated by using various kinds of the gapper 18.

Further, the gapper 18 functions to endure the pressure applied to the upper substrate 4. While the gapper 18 endures the pressure, the distance between the upper and lower substrates 2 and 4 is not shorter than necessary and the molten solder and the adhesive resin 13 are not applied with more pressure than necessary. Therefore, the molten solder and the adhesive resin 13 do not leak between the upper and lower substrates 2 and 4.

That is, the bond thickness can be regulated depending on the size of the gapper 18, and the gapper 18 can suppress the leakage of the molten solder and the adhesive resin 13 between the upper and lower substrates 2 and 4. Therefore, the fifth problem can be solved.

An operator may set a predetermined pressure for process S240 in consideration of the size of the gapper 18. If the gapper 18 has a large size, the bond thickness is large. Thus, the operator may set a predetermined pressure relatively low.

If the gapper 18 has a small size, the bond thickness is small. Thus, the operator may set a predetermined pressure relatively high.

If a lot of molten solder is located in the second region 7, the molten solder may cause a short circuit between the lower terminals 3, between the upper terminals 5, or between the solder bonding body 11c while being solidified later. If the solder bump 11b formed in process S240 is continuously applied with the predetermined pressure, it may be crushed. Therefore, the molten solder forming the solder bump 11b may be leaked from the first region 6 to the second region 7. However, the gapper 18 suppresses the leakage of the molten solder forming the solder bump 11b from the first region 6 to the second region 7 after the solder bump 11b is formed. Further, the adhesive resin 13 whose viscosity increases after the solder bump 11b is formed also functions to suppress the leakage of the molten solder from the first region 6 to the second region 7. Therefore, there is a low possibility of the occurrence of a short circuit caused by the gapper 18 and the adhesive resin 13.

Figure 9C:
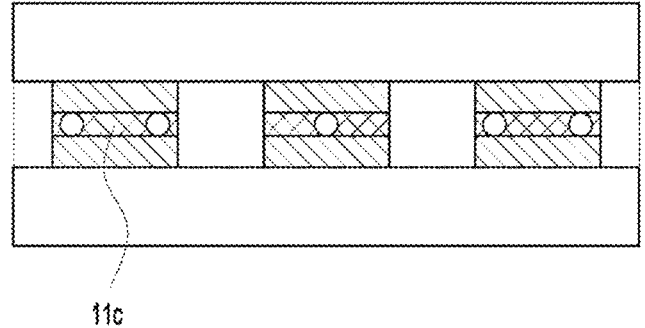

Then, referring to FIG. 9C, the heat and the predetermined pressure applied during process S240 are removed so that the solder bump 11b is cooled and solidified. Thus, the solder bonding body 11c is formed. That is, welding of the solder particles 11 is completed. If the upper and lower substrates 2 and 4 are bonded to each other by using the solder bonding body 11c and the adhesive resin 13 in the present process, the anisotropic conductive adhesive 1 has a higher bond strength as compared to the case where the upper and lower substrates 2 and 4 are bonded to each other by using only the adhesive resin 13 in process S240.

In the process of manufacturing the anisotropic conductive adhesive 1 (S210) before the component mounting process (from S220 to S240), the second reducing agent 17 is mixed with the solder particles 11 and the adhesive resin 13. However, before the component mounting process (from S220 to S240), the second reducing agent 17 does not react with the second oxide film 16 on the solder particles 11.

The second reducing agent 17 is applied with the heat in process S240 and then remove a part of the second oxide film 16 on the solder particles 11. Therefore, the welding time of the solder particles 11 can be reduced. The welding time of the solder particles 11 can be reduced to about 10 seconds which is similar to that of the conventional technology. Therefore, the above-described fourth problem does not occur.

The second reducing agent 17 is applied with the heat in process S240 and then reacts with the second oxide film 16 to generate oxidized residues or water. However, the amount of the second reducing agent 17 is controlled to be small, and, thus, the oxidized residues or water are evaporated in an instant without generation of voids. Therefore, the second reducing agent 17 functions to increase the welding speed of the solder particles 11 but does not cause the generation of voids. That is, although the anisotropic conductive adhesive 1 includes the second reducing agent 17, the above-described second problem does not occur.

Before the component mounting process (from S220 to S240), the solder particles 11 included in the anisotropic conductive adhesive 1 have the second oxide film 16 having an appropriate thickness. Therefore, as described above, the solder particles 11 are neither too stable nor too unstable.

Since the solder particles 11 are not too stable, the solder particles 11 can be welded despite the second oxide film 16 thereon. In other words, although the solder particles 11 has the second oxide film 16, the above-described first problem does not occur.

Since the solder particles 11 are not too unstable, an excessive amount of the solder particles is not agglomerated during the component mounting process (from S220 to S240). Further, the solder particles 11 are dispersed uniformly within the adhesive resin 13. In other words, there is no solder particle 11 agglomerated within the adhesive resin 13. Thus, a bridge is less likely to be formed. Therefore, it is possible to suppress a short circuit between the lower terminals 3, between the upper terminals 5, or between the solder bonding bodies 11c. That is, the above-described third problem does not occur.

Process S230 is similar to the pre-bonding process of the conventional technology and process S240 is similar to the bonding process of the conventional technology (refer to the bonding process described in [Background Art]). This means that the method for mounting a component using a gapper according to an example of the present invention can be performed by existing facilities. There is no need to construct new facilities for performing the method for mounting a component using a gapper according to an example of the present invention. Accordingly, facility construction costs can be reduced.

A short circuit is likely to occur particularly when a component having a micro-pitch is mounted. However, according to an example of the present invention, a short circuit is unlikely to occur. Therefore, the method for mounting a component using a gapper according to an example of the present invention can also be applied to mounting a component having a micro-pitch.

(i) The adhesive resin included in the anisotropic conductive adhesive according to an example of the present invention bonds the upper and lower substrates to each other while being cured during the component mounting process. (ii) The solder particles included in the anisotropic conductive adhesive bond the upper and lower terminals to each other while being welded during the component mounting process. (iii) If the component mounting process is performed using the anisotropic conductive adhesive, voids are not generated. From the above descriptions (i), (ii), and (iii), it can be seen that the anisotropic conductive adhesive has a stable contact resistance and a high bond strength compared to the conventional technology in which conductive particles are in simple contact with upper and lower terminals.

Furthermore, the melting point of the solder particles may be equal to or less than 220° C. Even if the solder particles have a low melting point, the anisotropic conductive adhesive including low-melting point solder particles also has all of the above-described effects.

Preferably, the melting point of the low-melting point solder particles is equal to or less than 150° C. The component mounting process can be performed at a low temperature using the anisotropic conductive adhesive including the low-melting point solder particles. In this case, there are advantages in terms of energy saving and cost saving.

Also, the upper and lower substrates bonded by using the anisotropic conductive adhesive the low-melting point solder particles are not manufactured at a high-temperature process and thus have excellent thermal fatigue characteristics.

More preferably, the melting point of the low-melting point solder particles is equal to or less than 140° C. In this case, the anisotropic conductive adhesive including the low-melting point solder particles has greater effects.

Still more preferably, the melting point of the low-melting point solder particles is equal to or less than 120° C. In this case, the anisotropic conductive adhesive including the low-melting point solder particles has maximized effects.

Hereafter, the method for manufacturing an anisotropic conductive adhesive will be described.

EXAMPLES

Example 1

Figure 10:
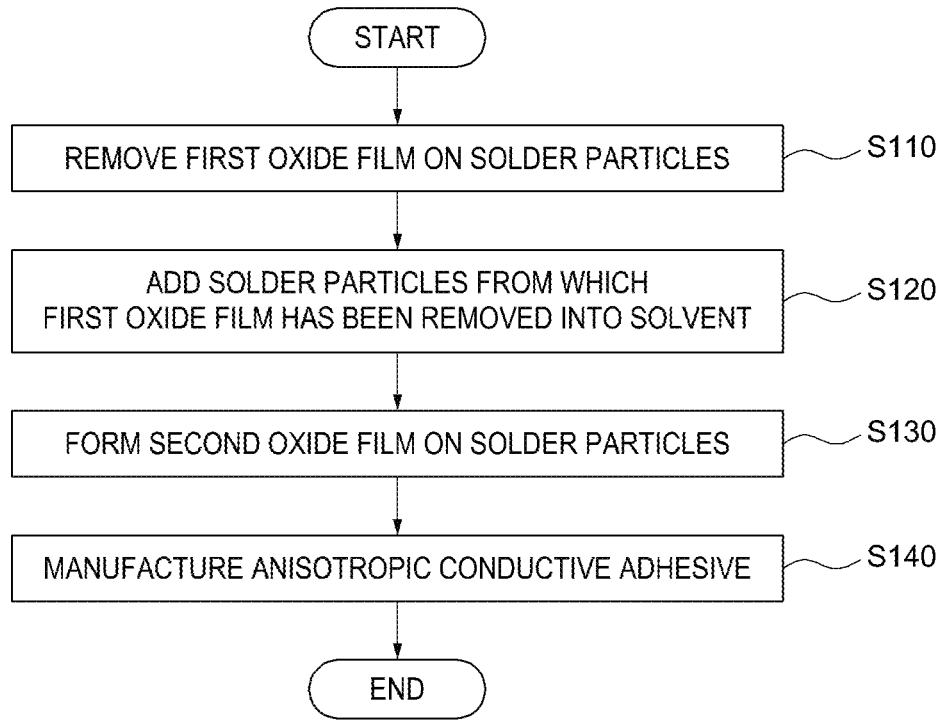
FIG. 10 is a flowchart showing a method for manufacturing an anisotropic conductive adhesive including a gapper according to an example of the present invention.
Figure 11:
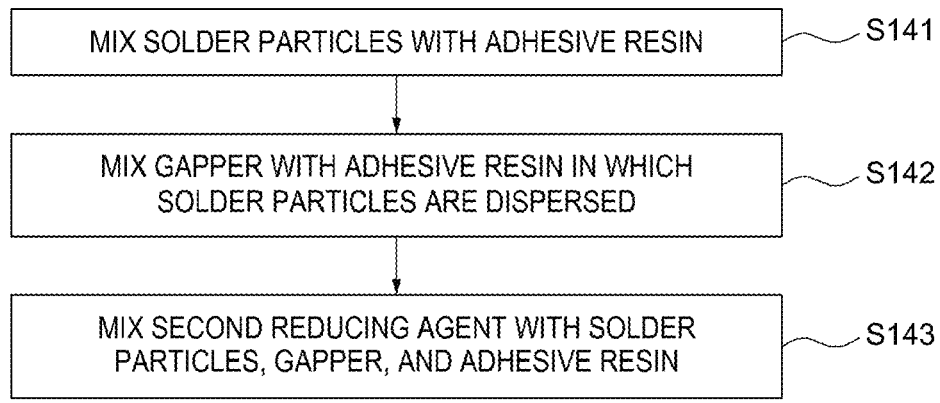
FIG. 11 is a flowchart showing a process of manufacturing an anisotropic conductive adhesive in a method for manufacturing an anisotropic conductive adhesive including a gapper according to an example of the present invention.

FIG. 10 is a flowchart showing a method for manufacturing an anisotropic conductive adhesive including a gapper according to an example of the present invention. FIG. 11 is a flowchart showing a process of manufacturing an anisotropic conductive adhesive in a method for manufacturing an anisotropic conductive adhesive including a gapper according to an example of the present invention. The method for manufacturing an anisotropic conductive adhesive including a gapper according to an example of the present disclosure will be described with reference to FIG. 10 and FIG. 11.

First, a first oxide film on solder particles is removed completely by a first reducing agent (S110). To remove the first oxide film, process S110 needs to be performed in an oxygen-free environment. For example, the first reducing agent and the solder particles are added into a first solvent and heat may be applied to the first solvent. The first reducing agent applied with heat may reduce and remove the first oxide film.

The first reducing agent may include a carboxyl group which reacts with the first oxide film. Specifically, the first reducing agent may include at least one material selected from the group consisting of oxalic acid, malonic acid, glutaric acid, adipic acid, pimelic acid, suberic acid, zelaic acid, and sebacic acid.

Then, the solder particles from which the first oxide film has been removed are added into a second solvent (S120). If the second solvent is different from the first solvent, the solder particles from which the first oxide film has been removed are taken out of the first solvent and then added into the second solvent. If the second solvent is identical to the first solvent, process S120 may be omitted.

The first solvent and the second solvent may include at least one material selected from the group consisting of ethanol, methanol, propanol, butanol, n-butanol, isopropyl alcohol, isobutyl alcohol, dimethyl acetamide, dimethyl formamide, dimethyl sulfoxide, tetrahydrofuran, triethylene phosphate, trimethyl phosphate, hexane, benzene, toluene, xylene, acetone, methylethylketone, methylisobutylketone, diisobutyl ketone, ethyl acetate, butyl acetate, dioxane, and diethyl ether.

Then, a second oxide film whose oxygen concentration is lower than that of the first oxide film is formed on the added solder particles (S130). In the second solvent, the second oxide film having an appropriate thickness is formed on the surfaces of the solder particles from which the first oxide film has been removed. In other words, the second oxide film having an appropriate oxygen concentration is formed on the surfaces of the solder particles.

Preferably, the oxygen concentration of the second oxide film may be from 25 wt ppm to 95 wt ppm relative to a total weight of the solder particles and the second oxide film. If the oxygen concentration of the second oxide film is less than 25 wt ppm, the second oxide film is too thin. Thus, the surface energy of the solder particles may be too high. Therefore, the solder particles may be agglomerated. In this case, a short circuit may occur during the component mounting process. If the oxygen concentration of the second oxide film is more than 95 wt ppm, the second oxide film may be too thick. Thus, the solder particles may be too stable.

Therefore, it may be difficult to weld the solder particles during component mounting process.

More preferably, the oxygen concentration of the second oxide film is from 25 wt ppm to 91 wt ppm relative to the total weight of the solder particles and the second oxide film. In this range, the dispersibility of the solder particles can be secured and the possibility of welding the solder particles can be further increased.

Still more preferably, the oxygen concentration of the second oxide film is from 25 wt ppm to 80 wt ppm relative to the total weight of the solder particles and the second oxide film. In this range, the dispersibility of the solder particles can be secured and the possibility of welding the solder particles can be maximized.

According to the method for forming a second oxide film having an appropriate oxygen concentration, methods for manufacturing an anisotropic conductive adhesive can be classified into a wet method (Example 1), a wet-ultrasonic method (Example 2), and a dry method (Example 3). In the present wet method, the solder particles and the second solvent are stirred to form a second oxide film having an appropriate oxygen concentration. The level of dissolved oxygen in the second solvent may vary depending on the stirring time. Herein, the stirring time for making an appropriate oxygen concentration may vary depending on the temperature of the second solvent. The operator can make an appropriate oxygen concentration by increasing the temperature of the second solvent and then performing stirring for a relatively short time. If the second solvent does not have a high temperature, the operator can make an appropriate oxygen concentration by performing stirring for a relatively long time.

Since the thickness of the second oxide film is optimized in process S130, subsequent processes may be performed preferably in an oxygen-free atmosphere. For example, the subsequent processes may be performed preferably in an inert gas atmosphere, a vacuum atmosphere, etc.

Then, the solder particles, the gapper, and the adhesive resin are mixed to prepare an anisotropic conductive adhesive (S140). Process S140 can be performed as described below.

First, the solder particles having the second oxide film thereon are mixed with the adhesive resin so that the solder particles having the second oxide film thereon are dispersed uniformly within the adhesive resin (S141). Since the second oxide film having an appropriate oxygen concentration is formed in process S130, the solder particles are not agglomerated after process S130.

Then, the adhesive resin in which the solder particles are dispersed is mixed with the gapper (S142).

Preferably, the amount of the gapper to be mixed is 2 vol % to 60 vol % relative to the volume of the adhesive resin.

If the gapper is mixed at more than 60 vol %, the adhesive resin has a relatively small amount within the anisotropic conductive adhesive. Thus, after the component mounting process, the anisotropic conductive adhesive may have a low bond strength. Further, in this case, the amount of the solder particles within the anisotropic conductive adhesive is relatively small. Thus, during the component mounting process, a solder bonding body may not be solidly formed. This means that the anisotropic conductive adhesive has a low conductivity and its contact resistance can be unstable.

If the gapper is mixed at less than 2 vol %, the gapper may not be located between some upper and lower terminals during the component mounting process. The distance between the some upper and lower terminals is not maintained by the gapper, and, thus, the distance may be smaller than the size of the gapper. Therefore, in this case, the overall bond thickness may not be uniform. Then, a second reducing agent is mixed with the solder particles, the gapper, and the adhesive resin (S143). The second reducing agent may include a carboxyl group which reacts with the second oxide film. Specifically, the second reducing agent may include at least one material selected from the group consisting of oxalic acid, malonic acid, glutaric acid, adipic acid, pimelic acid, suberic acid, zelaic acid, and sebacic acid.

Preferably, the amount of the second reducing agent to be mixed is more than 0 wt % and less than 2 wt % relative to the weight of the solder particles. As described above, a small amount of the second reducing agent needs to be included in the anisotropic conductive adhesive to increase the welding speed. However, if the second reducing agent is included at 2 wt % or more relative to the weight of the solder particles in the anisotropic conductive adhesive, the second reducing agent may excessively react with the second oxide film during the component mounting process, and, thus, oxidized residues and water may be excessively generated. While the oxidized residues or water are evaporated, voids may remain in the anisotropic conductive adhesive.

More preferably, the amount of the second reducing agent to be mixed is 0.3 wt % to 1.5 wt % relative to the weight of the solder particles. Even when the amount of the second reducing agent to be mixed is more than 0 wt % and less than 0.3 wt %, the welding time of the solder particles can be reduced, but can be hardly reduced to 10 seconds as achieved in the conventional technology (refer to the bonding process described in [Background Art]). If the amount of the second reducing agent to be mixed is more than 1.5 wt %, the possibility of the generation of voids still remains, although not as much as when the amount of the second reducing agent is 2 wt % or more.

Still more preferably, the amount of the second reducing agent to be mixed is 0.3 wt % to 1 wt % relative to the weight of the solder particles. If the amount of the second reducing agent to be mixed is 1 wt % or less, the possibility of the generation of voids can be excluded completely. Even if the amount of the second reducing agent to be mixed is more than 1 wt %, the welding time of the solder particles is not further reduced compared to the welding time in case of 1 wt % or less.

When process S143 is completed, an anisotropic conductive adhesive in the form of paste is manufactured. When the prepared paste is coated on a release film of a tape molding machine, an anisotropic conductive adhesive in the form of a film can be manufactured.

Between process S110 and process S120, a water removing process may be performed. When the first reducing agent removes the first oxide film, water may be generated. This is because the carboxyl group of the first reducing agent can react with oxygen of the first oxide film. If water is present around the solder particles, the water may be mixed in the adhesive resin together with the solder particles in process S141. Accordingly, an anisotropic conductive adhesive including the water may be manufactured. If the anisotropic conductive adhesive manufactured as described above is applied with heat during the component mounting process, the water may be evaporated and generate voids. The voids may hinder the welding of the solder particles. Further, if the voids are generated in the second region, they may cause a short circuit between the lower terminals, between the upper terminals, or between the solder bonding bodies.

The water removing process may be performed as described below. After the first oxide film on the solder particles is removed in the first solvent, the first solvent including the solder particles may be charged into a vacuum heating stirring tank. When the solder particles and the first solvent are heated with stirring in the vacuum heating stirring tank, the water may be evaporated and deaerated.

Example 2

Example 2 is different from Example 1 in the method for forming a second oxide film. In the present wet-ultrasonic method, ultrasonic waves are irradiated to the second solvent including the solder particles therein to form a second oxide film having an appropriate oxygen concentration of Example 1.

The level of dissolved oxygen in the second solvent may vary depending on the frequency of ultrasonic waves and the ultrasonic wave irradiation time. Herein, the frequency of ultrasonic waves and the ultrasonic wave irradiation time for making an appropriate oxygen concentration may vary depending on the temperature of the second solvent. The operator can make an appropriate oxygen concentration by increasing the temperature of the second solvent and then irradiating ultrasonic waves at a relatively low frequency for a relatively short time. If the second solvent does not have a high temperature, the operator can make an appropriate oxygen concentration by irradiating ultrasonic waves at a relatively high frequency for a relatively long time.

Example 3

Example 3 is different from Example 1 in the method for forming a second oxide film. In the present dry method, the second solvent including the solder particles is charged into an oven to form a second oxide film having an appropriate oxygen concentration of Example 1. Herein, the oven is prepared for forming the second oxide film and thus is not a vacuum oven.

The second solvent including the solder particles is left in the oven for a predetermined time. The operator can freely set the internal temperature of the oven and the leaving time. The operator can make an appropriate oxygen concentration by setting the internal temperature of the oven relatively high and leaving the second solvent for a relatively short time. The operator can make an appropriate oxygen concentration by setting the internal temperature of the oven relatively low and leaving the second solvent for a relatively long time.

For reference, if the first reducing agent and the solder particles having the first oxide film thereon are put into the first solvent, a carboxyl group reacts with the first oxide film to generate water and various reduction residual impurities are also generated. The wet method and the wet-ultrasonic method can remove the reduction residual impurities generated in process S110 by vibrating the second solvent, which is more excellent than the dry method. Hereafter, Preparation Examples, Comparative Examples, and Test Examples will be described.

Preparation Example 1: Formation of Second Oxide Film by Wet-Ultrasonic Method, Gapper with Diameter of 10 μm Sn-3.0Ag-0.5Cu solder particles (melting point: 219° C., mean diameter: 15 μm) were prepared. A bisphenol A epoxy resin which is a thermosetting resin was prepared as an adhesive resin. As a first reducing agent, 1,3-Bis(3-carboxypropyl)tetramethyldisiloxane was prepared. As a gapper, polymethyl methacrylate (PMMA, diameter of 10 μm) was prepared. Further, toluene was prepared as a solvent.

The solder particles were put into the solvent. The mass ratio of the solder particles to the solvent was 1:1.

Figure 12A:
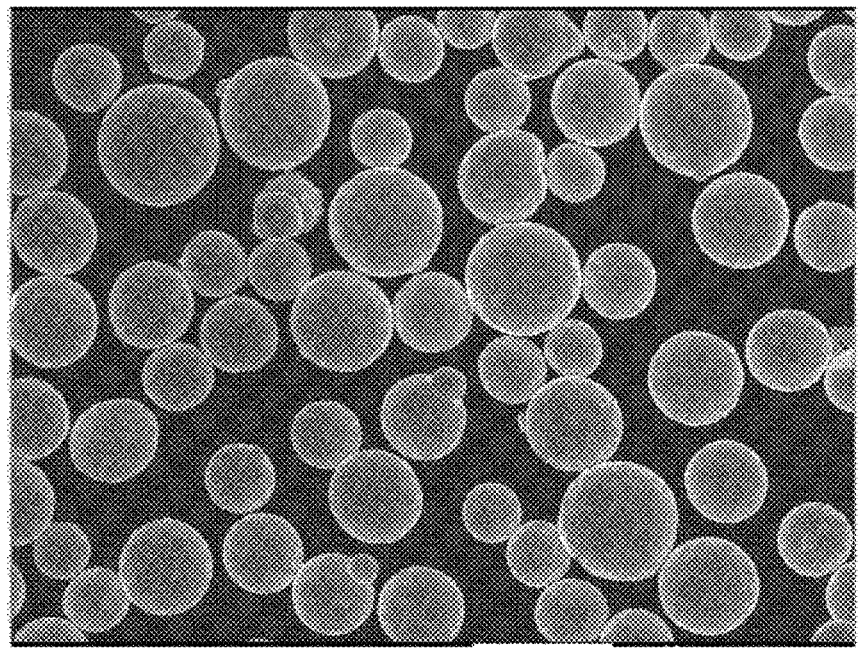
FIG. 12A and FIG. 12B are SEM images of solder particles having a first oxide film thereon.
Figure 12B:
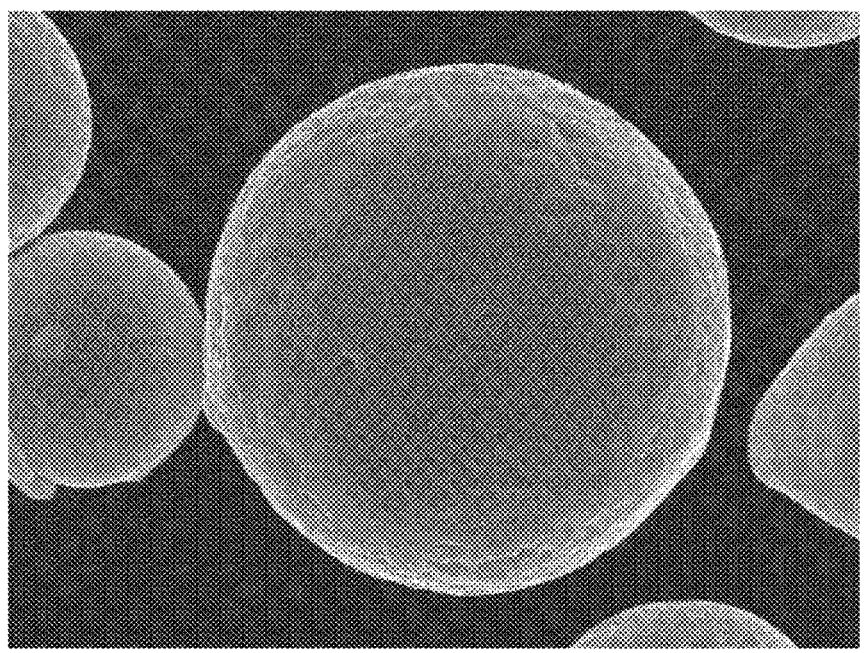

Then, the first reducing agent was added into the solvent, and the solvent including the first reducing agent and the solder particles was heated at 150° C. for 30 minutes. Accordingly, a first oxide film was removed. FIG. 12A and FIG. 12B are SEM images of the solder particles having the first oxide film thereon before the first oxide film was removed. Further, before the first oxide film was removed, the oxygen concentration of the first oxide film was measured. The oxygen concentration of the first oxide film was measured at 130 wt ppm. The oxygen concentration of the first oxide film was measured by measuring the concentration of a gas generated by burning the solder particles having the first oxide film thereon.

Then, ultrasonic waves with a frequency of 40 MHz were irradiated to the solvent at room temperature. The ultrasonic wave irradiation time was changed in the range of from 5 minutes to 40 minutes to prepare a plurality of samples. Each of the samples includes a solvent sample and a solder particle sample within the solvent sample. The oxygen concentrations of second oxide films formed on the respective solder particle samples were as shown in the following Table 1.

TABLE 1

| | 5 | 10 | 15 | 20 | 30 | 31 | 32 | 33 | 34 | 35 | 36 | 37 | 38 | 39 | 40 |
|---|---|---|---|---|---|---|---|---|---|---|---|---|---|---|---|
| Oxygen concentration | ND | 17 | 20 | 25 | 71 | 76 | 77 | 80 | 85 | 90 | 94 | 96 | 97 | 96 | 98 |

(Unit: wt ppm)

Figure 13A:
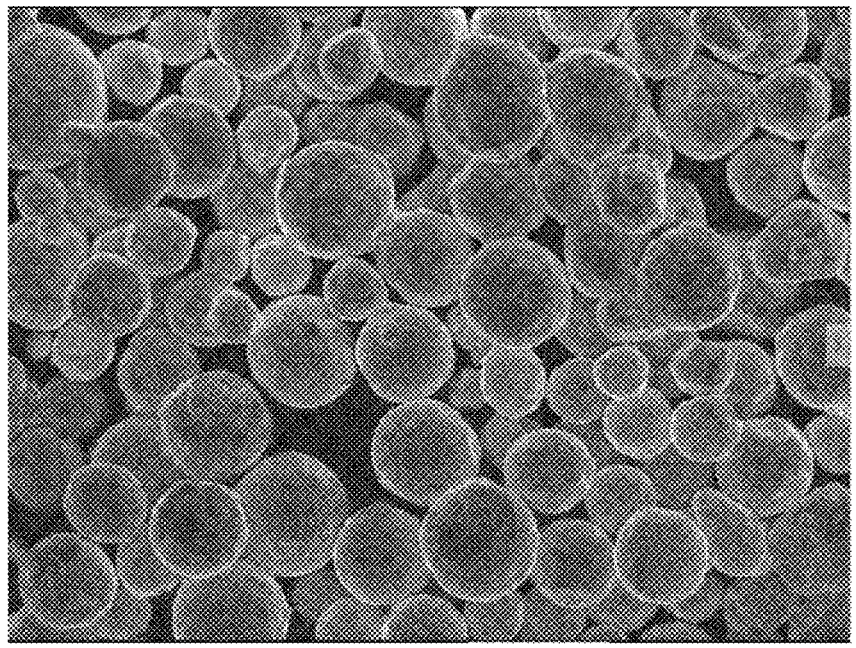
FIG. 13A and FIG. 13B are SEM images of solder particles having a second oxide film thereon according to a preparation example of the present invention.
Figure 13B:
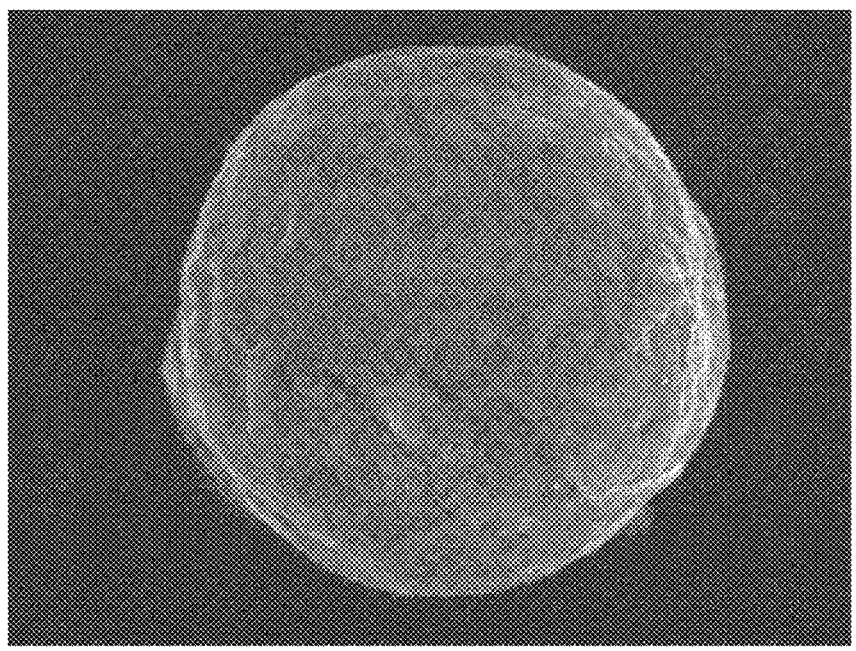

The data in Table 1 were obtained by measuring the concentrations of gases generated by burning the respective solder particle samples. FIG. 13A and FIG. 13B are SEM images of a solder particle sample whose second oxide film has an oxygen concentration of 71 wt ppm. By comparison with FIG. 12, it can be seen that the solder particles shown in FIG. 13 have more rough surfaces through the control of oxide films (i.e., through the removal of the first oxide film and the formation of the second oxide film).

Then, each solder particle sample was taken out of each solvent sample and then mixed with the gapper and the adhesive resin. Accordingly, a plurality of pastes was manufactured. Each of the pastes is composed of the solder particles 68 wt %, the adhesive resin 26.9 wt %, the gapper 5 wt %, and the other ingredients 0.1 wt % relative to a total weight of the paste. The content of the gapper is 10 vol % relative to the volume of the adhesive resin.

The pastes were coated on a release film to form a plurality of films. While the plurality of films was formed, the ambient temperature was maintained at 80° C. to remove a small amount of the solvent mixed in the pastes.

As for the prepared films, the dispersibility of the solder particles was observed with an optical microscope. A result thereof was as shown in the following Table 2.

TABLE 2

| | 5 | 10 | 15 | 20 | 30 | 31 | 32 | 33 | 34 | 35 | 36 | 37 | 38 | 39 | 40 |
|---|---|---|---|---|---|---|---|---|---|---|---|---|---|---|---|
| Presence or absence of dispersion | X | X | X | ○ | ○ | ○ | ○ | ○ | ○ | ○ | ○ | ○ | ○ | ○ | ○ |

Unit: minute,
X: No dispersion of solder particles,
○: Dispersion of solder particles Referring to Table 2, it is confirmed that when the ultrasonic wave irradiation time is 20 minutes or more, the solder particles are dispersed within the adhesive resin.

Referring to Table 1 and Table 2, it is confirmed that when the ultrasonic wave irradiation time is 20 minutes or more, the oxygen concentration of the second oxide film becomes 25 wt ppm or more and the solder particles are dispersed.

Preparation Example 2: Formation of Second Oxide Film by Wet-Ultrasonic Method, Gapper with Diameter of 30 μm A film was manufactured by the same method as in Preparation Example 1 except that a gapper having a diameter of 30 μm was used and the ultrasonic wave irradiation time was set to 30 minutes. Dispersion of the solder particles within the manufactured film was observed with an optical microscope.

Preparation Example 3: Formation of Second Oxide Film by Dry Method

After a first oxide film was removed by the same method as in Preparation Example 1, a solvent including solder particles was charged into an oven. The solvent including the solder particles was left in the oven at 100° C. The leaving time was changed in the range of from 2 to 30 to prepare a plurality of samples. The oxygen concentrations of second oxide films formed on the respective solder particle samples were as shown in the following Table 3.

TABLE 3

| | 2 | 5 | 6 | 7 | 8 | 10 | 20 | 30 |
|---|---|---|---|---|---|---|---|---|
| Oxygen concentration | ND | 29 | 78 | 82 | 91 | 94 | 96 | 96 |

Unit: wt ppm

Then, a plurality of films was manufactured by the same method as in Preparation Example 1. As for the prepared films, the dispersibility of the solder particles was observed with an optical microscope. A result thereof was as shown in the following Table 4.

TABLE 4

| | 2 | 5 | 6 | 7 | 8 | 10 | 20 | 30 |
|---|---|---|---|---|---|---|---|---|
| Presence or absence of dispersion | X | ○ | ○ | ○ | ○ | ○ | ○ | ○ |

Unit: minute,
X: No dispersion of solder particles,
○: Dispersion of solder particles Referring to Table 4, it is confirmed that when the leaving time is 5 minutes or more, the solder particles are dispersed within the adhesive resin.

Referring to Table 3 and Table 4, it is confirmed that when the leaving time is 5 minutes or more, the oxygen concentration of the second oxide film is 29 wt ppm or more and the solder particles are dispersed.

Comparative Example 1: Except Gapper

A film was manufactured by the same method as in Preparation Example 1 except that the ultrasonic wave irradiation time was set to 30 minutes and a gapper was not mixed with solder particles and an adhesive resin. Dispersion of the solder particles within the manufactured film was observed with an optical microscope.

Comparative Example 2: No Formation of Second Oxide Film after Removal of First Oxide Film A first oxide film was removed by the same method as in Preparation Example 1. Then, solder particles and an adhesive resin were mixed with each other without irradiation of ultrasonic waves. A film was manufactured by the same method as in Preparation Example 1 except that ultrasonic waves were not irradiated. No dispersion of the solder particles within the manufactured film was observed with an optical microscope.

Test Example 1: Evaluation on Presence or Absence of Short Circuit

As for the films prepared in Preparation Examples 1 to 3 and Comparative Examples 1 and 2, a component mounting process was performed to check whether solder particles cause a short circuit. Then, a short circuit evaluation test was carried out. Among the films prepared in Preparation Examples 1 to 3, some films in which solder particles were not dispersed when observed with an optical microscope were not used in the short circuit evaluation test.

A pair of FPCBs including a terminal having a pitch of 70 μm and a width (perpendicular to the pitch) of 100 μm were prepared.

Each of the films prepared in Preparation Examples 1 to 3 and Comparative Examples 1 and 2 was attached to the lower FPCB. After the attached film was covered with the upper FPCB, a hot bar primarily thermocompression bonded the upper FPCB at 70° C. and 0.2 MPa. Accordingly, the upper and lower FPCBs were pre-bonded to each other. Then, the hot bar secondarily thermocompression bonded the upper FPCB at 245° C. and 1 MPa for 10 seconds.

As a result of the short circuit evaluation test, a short circuit occurred in the FPCBs bonded using the films prepared in Comparative Examples 1 and 2. However, a short circuit did not occur in the FPCBs bonded using the films prepared in Preparation Examples 1 to 3.

Figure 14A:
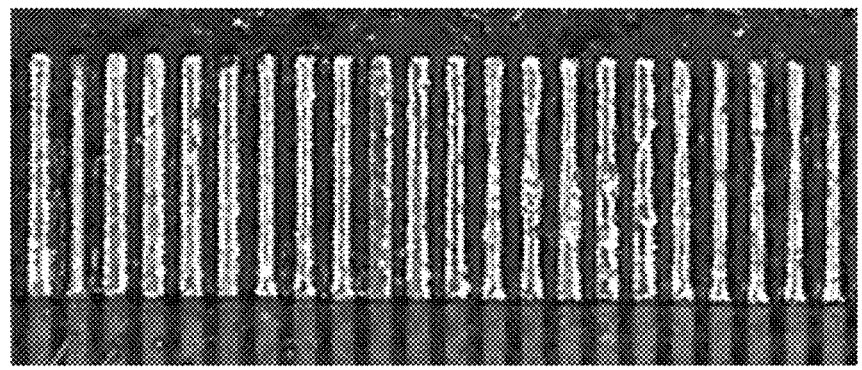
FIG. 14A and FIG. 14B are photomicrographs of a solder bonding body according to an experimental example of the present invention.
Figure 14B:
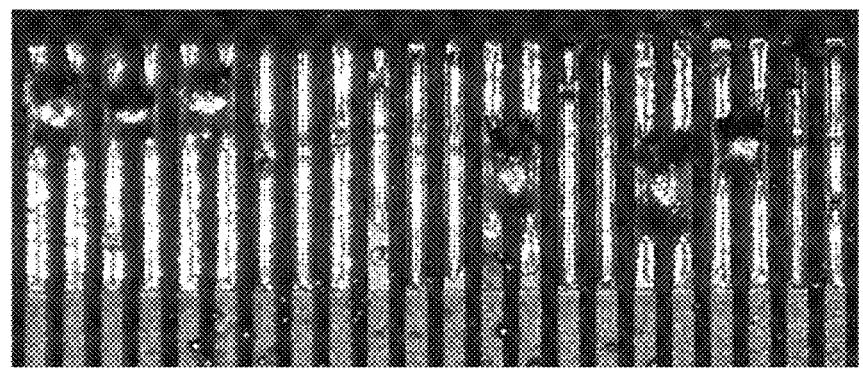

FIG. 14A is a photomicrograph of a solder bonding body taken after the component mounting process was performed using any one of the films prepared in Preparation Examples 1 to 3. FIG. 14B is a photomicrograph of a solder bonding body taken after the component mounting process was performed using the film prepared in Comparative Example 2. FIG. 14B shows a bridge between solder bonding bodies which is not shown in FIG. 14A. Therefore, it was confirmed that when the first oxide film on the solder particles is removed, the surface energy of the solder particles increases and the solder particles are agglomerated and during the component mounting process, a short circuit occurs. Further, it was confirmed that if the oxide films on the solder particles are appropriately controlled, it is possible to suppress the agglomeration of the solder particles and also possible to suppress a short circuit during the component mounting process.

In Comparative Example 1, a short circuit occurred although the dispersibility of the solder particles was not bad. This is because during the secondary thermocompression bonding, a solder bump was formed and a part of the solder bump was leaked to the second region. Accordingly, it was confirmed that the gapper can suppress the leakage of molten solder forming the solder bump from the first region to the second region.

Figure 15A:
FIG. 15A and FIG. 15B are photomicrographs of a thermocompression bonded component according to an experimental example of the present invention.
Figure 15B:

FIG. 15A is a photomicrograph of an FPCB bonded using any one of the films prepared in Preparation Examples 1 to 3. FIG. 15B is a photomicrograph of an FPCB bonded using the film prepared in Preparation Example 2. FIG. 15A shows the bond thickness of 10 μm which is the diameter of the gapper. Further, FIG. 15B shows the bond thickness of 30 μm which is the diameter of the gapper. Accordingly, it is confirmed that the bond thickness can be regulated depending on the size of the gapper.

Test Example 2: Evaluation on Presence or Absence of Welding

As for the FPCBs bonded in Test Example 1, the presence or absence of welding of the solder particles was observed with an optical microscope.

The presence or absence of welding of the solder particles in the FPCBs bonded using the films prepared in Preparation Example 1 depending on the ultrasonic wave irradiation time was as shown in the following Table 5.

TABLE 5

| | 5 | 10 | 15 | 20 | 30 | 31 | 32 | 33 | 34 | 35 | 36 | 37 | 38 | 39 | 40 |
|---|---|---|---|---|---|---|---|---|---|---|---|---|---|---|---|
| Presence or absence of welding | ○ | ○ | ○ | ○ | ○ | ○ | ○ | ○ | Δ | Δ | X | X | X | X | X |

Unit: minute,

X: No welding of solder particles,

Δ: Partial welding of solder particles,

○: Welding of solder particles

Referring to Table 5, it is confirmed that when the ultrasonic wave irradiation time is 35 minutes or less, the solder particles are welded. Also, it is confirmed that when the ultrasonic wave irradiation time is more than 35 minutes, the above-described first problem occurs.

Tables 1, 2, and 5 are combined into the following Table 6.

TABLE 6

| | 5 | 10 | 15 | 20 | 30 | 31 | 32 | 33 | 34 | 35 | 36 | 37 | 38 | 39 | 40 |
|---|---|---|---|---|---|---|---|---|---|---|---|---|---|---|---|
| Oxygen concentration | ND | 17 | 20 | 25 | 71 | 76 | 77 | 80 | 85 | 90 | 94 | 96 | 97 | 96 | 98 |
| Presence or absence of dispersion | X | X | X | ○ | ○ | ○ | ○ | ○ | ○ | ○ | ○ | ○ | ○ | ○ | ○ |
| Presence or absence of welding | ○ | ○ | ○ | ○ | ○ | ○ | ○ | ○ | Δ | Δ | X | X | X | X | X |

Referring to Table 6, it is confirmed that when the ultrasonic wave irradiation time is in the range of from 20 minutes to 35 minutes, the oxygen concentration of the second oxide film is in the range of from 25 wt ppm to 90 wt ppm and the solder particles are dispersed in the adhesive resin and welded to the upper and lower terminals during the component mounting process. Further, it is confirmed that when the ultrasonic wave irradiation time is in the range of from 20 minutes to 33 minutes, the oxygen concentration of the second oxide film is in the range of from 25 wt ppm to 80 wt ppm and the solder particles are more stably welded.

The presence or absence of welding of the solder particles in the FPCBs bonded using the films prepared in Preparation Example 3 depending on the leaving time was as shown in the following Table 7.

TABLE 7

| | 2 | 5 | 6 | 7 | 8 | 10 | 20 | 30 |
|---|---|---|---|---|---|---|---|---|
| Presence or absence of welding | ○ | ○ | ○ | Δ | Δ | X | X | X |

Unit: minute,

X: No welding of solder particles,

Δ: Partial welding of solder particles,

○: Welding of solder particles

Referring to Table 7, it is confirmed that when the leaving time is 8 minutes or less, the solder particles are welded. Also, it is confirmed that when the leaving time is more than 8 minutes, the above-described first problem occurs.

Tables 3, 4, and 7 are combined into the following Table 8.

TABLE 8

| | 2 | 5 | 6 | 7 | 8 | 10 | 20 | 30 |
|---|---|---|---|---|---|---|---|---|
| Oxygen concentration | ND | 29 | 78 | 82 | 91 | 94 | 96 | 96 |
| Presence or absence of dispersion | X | ○ | ○ | ○ | ○ | ○ | ○ | ○ |

TABLE 8-continued

| | 2 | 5 | 6 | 7 | 8 | 10 | 20 | 30 |
|---|---|---|---|---|---|---|---|---|
| Presence or absence of welding | ○ | ○ | ○ | Δ | Δ | X | X | X |

Referring to Table 8, it is confirmed that when the leaving time is in the range of from 5 minutes to 8 minutes, the oxygen concentration of the second oxide film is in the range of from 29 wt ppm to 91 wt ppm and the solder particles are dispersed in the adhesive resin and welded to the upper and lower terminals during the component mounting process. Further, it is confirmed that when the leaving time is in the range of from 5 minutes to 6 minutes, the oxygen concentration of the second oxide film is in the range of from 29 wt ppm to 78 wt ppm and the solder particles are more stably welded.

Preparation Example 4: Preparation of Anisotropic Conductive Adhesive Including Low-Melting Point Solder Particle As for Sn-58Bi (melting point: 139° C.) which serves as low-melting point solder particles, a film was manufactured by the same method as in Preparation Example 3. Herein, when the first oxide film was removed, the solvent was heated at a temperature of 100° C. and ultrasonic waves were irradiated for 30 minutes. As for the prepared film, dispersion of the low-melting point solder particles within the adhesive resin was observed with an optical microscope.

Test Example 3: Evaluation on Presence or Absence of Short Circuit and Welding

As for the film manufactured in Preparation Example 4, a component mounting process was performed by the same method as in Test Example 1. Herein, when secondary thermocompression bonding was performed, the upper FPCB was applied with heat of 145° C.

As a result of an evaluation on the presence or absence of a short circuit carried out by the same method as in Test Example 1, it was confirmed that a short circuit did not occur in a component bonded using the prepared film.

As a result of an evaluation on the presence or absence of welding carried out by the same method as in Test Example 2, it was confirmed that the low-melting point solder particles were stably welded.

Although the present invention has been described with reference to the examples illustrated in the drawings, the present invention is not limited thereto and it should be understood by a person with ordinary skill in the art that various modifications and equivalents may be made therein. Therefore, the spirit of the present invention is defined only by the appended claims.

REFERENCE SIGNS LIST

1: Anisotropic conductive adhesive
11: Solder particle
11a: Molten solder
11b: Solder bump
11c: Solder bonding body
11d: Bridge
12: Reducing agent
13: Adhesive resin
14: First oxide film
15: Void
16: Second oxide film
17: Second reducing agent
18: Gapper
2: Lower substrate
3: Lower terminal
4: Upper substrate
5: Upper terminal
6: First region
7: Second Region

What is claimed is:

1. A method for manufacturing an anisotropic conductive adhesive including a gapper, the method comprising:
   removing a first oxide film on solder particles by using a first reducing agent;
   adding the solder particles, from which the first oxide film has been removed, into a solvent;
   forming a second oxide film, whose oxygen concentration is lower than that of the first oxide film, on the added solder particles; and
   manufacturing the anisotropic conductive adhesive by mixing the solder particles with the second oxide film formed thereon, the gapper, and an adhesive resin.

2. The method of claim 1,
wherein the gapper includes at least one material selected from the group consisting of a polymer bead, a polymer particle, an inorganic particle, and mixtures thereof.

3. The method of claim 2,
wherein the polymer bead includes at least one material selected from the group consisting of polymethyl methacrylate, polystyrene, polyurethane, polyethylene, polyethyleneimine, polypropylene, and polyisobutylene.

4. The method of claim 2,
wherein the polymer particle includes Teflon or polyethylene.

5. The method of claim 2,
wherein the inorganic particle includes at least one material selected from the group consisting of alumina, silica, glass, and silicon carbide.

6. The method of claim 1,
wherein in the manufacturing of the anisotropic conductive adhesive, the gapper is mixed at 2 vol % to 60 vol % relative to the volume of the adhesive resin.

7. The method of claim 1,
wherein in the forming of the second oxide film, the second oxide film accounts for 25 wt ppm to 95 wt ppm relative to a total weight of the solder particles and the second oxide film.

8. The method of claim 1,
wherein in the forming of the second oxide film, the solder particles and the solvent are stirred to form the second oxide film.

9. The method of claim 1,
wherein in the forming of the second oxide film, ultrasonic waves are irradiated to the solvent into which the solder particles have been added to form the second oxide film.

10. The method of claim 1,
wherein in the forming of the second oxide film, the solvent into which the solder particles have been added is charged and left in an oven to form the second oxide film.

11. The method of claim 1,
wherein in the manufacturing of the anisotropic conductive adhesive, a second reducing agent is further mixed with the solder particles, the gapper, and the adhesive resin.

12. The method of claim 11,
wherein in the manufacturing of the anisotropic conductive adhesive, the second reducing agent is mixed at more than 0 wt % and less than 2 wt % relative to the weight of the solder particles.

* * * * *